(12) United States Patent
Kim et al.

(10) Patent No.: US 10,418,388 B2
(45) Date of Patent: Sep. 17, 2019

(54) GATE DRIVER CIRCUIT AND DISPLAY DEVICE USING THE SAME

(71) Applicant: LG Display Co., Ltd., Seoul (KR)

(72) Inventors: Minseo Kim, Paju-si (KR); Youngsun Jang, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/997,988

(22) Filed: Jun. 5, 2018

(65) Prior Publication Data
US 2019/0057978 A1 Feb. 21, 2019

(30) Foreign Application Priority Data
Aug. 16, 2017 (KR) .......................... 10-2017-0103824

(51) Int. Cl.
*G09G 3/36* (2006.01)
*H01L 27/12* (2006.01)
(Continued)

(52) U.S. Cl.
CPC ......... *H01L 27/124* (2013.01); *G09G 3/3258* (2013.01); *G09G 3/3266* (2013.01); *G09G 3/3291* (2013.01); *H01L 27/3262* (2013.01); *H01L 27/3276* (2013.01); *H01L 51/5203* (2013.01); *G09G 2310/0202* (2013.01); *G09G 2310/0243* (2013.01); *G09G 2310/0278* (2013.01); *G09G 2310/0286* (2013.01); *G09G 2310/08* (2013.01); *G09G 2320/0295* (2013.01); *G09G 2320/045* (2013.01); *G09G 2330/021* (2013.01)

(58) Field of Classification Search
CPC ... G09G 3/3266; G09G 2310/00–0278; G09G 2310/0286–0289
See application file for complete search history.

(56) References Cited

U.S. PATENT DOCUMENTS

2013/0222352 A1* 8/2013 Jeong .................. G09G 3/3266
345/205
2016/0217728 A1 7/2016 In et al.
(Continued)

FOREIGN PATENT DOCUMENTS

EP 3159884 A2 4/2017

OTHER PUBLICATIONS

Extended European Search Report issued in corresponding European Patent Application No. 18185517.2, dated Dec. 11, 2018.

*Primary Examiner* — Sanghyuk Park
(74) *Attorney, Agent, or Firm* — Morgan, Lewis & Bockius LLP

(57) ABSTRACT

A gate driver circuit and a display device using the same are disclosed. The gate driver circuit includes a first transistor supplying a start signal to a Q node in response to a clock, a second transistor adjusting a gate voltage of the first transistor in response to the clock, a third transistor adjusting a gate voltage of the second transistor in response to the start signal, a fourth transistor changing a voltage of a QB node, a fifth transistor switching a current path between the first transistor and the Q node in response to a first line control signal, a sixth transistor supplying a gate-off voltage to an output node, a seventh transistor supplying a gate-on voltage to the output node, and an eighth transistor supplying a second line control signal to the QB node.

16 Claims, 18 Drawing Sheets

(51) Int. Cl.
*G09G 3/3258* (2016.01)
*G09G 3/3266* (2016.01)
*G09G 3/3291* (2016.01)
*H01L 27/32* (2006.01)
*H01L 51/52* (2006.01)

(56) References Cited

U.S. PATENT DOCUMENTS

2016/0225341 A1* 8/2016 Ma ............................ G09G 3/20
2016/0351152 A1* 12/2016 Dai ...................... G09G 3/3677
2017/0116926 A1* 4/2017 Bong ................... G09G 3/3266

* cited by examiner

GATE DRIVER CIRCUIT AND DISPLAY DEVICE USING THE SAME

This application claims the benefit of Korean Patent Application No. 10-2017-0103824 filed on Aug. 16, 2017, the entire contents of which is incorporated herein by reference for all purposes as if fully set forth herein.

BACKGROUND

Technical Field

The present disclosure relates to a gate driver circuit, which is disposed on the same substrate as circuit elements of an active area displaying an input image, and a display device using the gate driver circuit.

Discussion of the Related Art

An electroluminescent display is classified into an inorganic electroluminescent display and an organic electroluminescent display depending on a material of an emission layer. An active matrix organic light emitting diode (OLED) display includes a plurality of OLEDs capable of emitting light by themselves and has many advantages, such as fast response time, high emission efficiency, high luminance, wide viewing angle, and the like.

The OLED display reproduces an input image using self-emitting elements such as OLEDs. The OLED includes an anode, a cathode, and an organic compound layer between the anode and the cathode. The organic compound layer generally includes a hole injection layer HIL, a hole transport layer HTL, an emission layer EML, an electron transport layer ETL, and an electron injection layer EIL. When a power voltage is applied to the anode and the cathode, holes passing through the hole transport layer HTL and electrons passing through the electron transport layer ETL move to the emission layer EML and combine, thereby forming excitons. As a result, the emission layer EML generates visible light by the excitons.

A driver circuit of a flat panel display includes a data driver circuit for supplying a data signal to data lines, a gate driver circuit for supplying a gate signal (or referred to as "scan signal") to gate lines (or referred to as "scan lines"), and the like. The gate driver circuit may be directly formed on the same substrate as circuit elements of an active area constituting a screen. The circuit elements of the active area constitute a pixel circuit formed in each of pixels that are defined by the data lines and the gate lines of a pixel array in a matrix. The circuit elements of the active area and the gate driver circuit each include a plurality of transistors. Hereinafter, the gate driver circuit, which is directly formed on a substrate of a display panel together with the circuit elements of the active area, is referred to as a "GIP circuit".

A digital flat panel display generally writes data to pixels using a progressive scan method. The progressive scan method writes in sequence data to all lines of the active area for a vertical active time of one frame period. For example, after the progressive scan method simultaneously writes data to pixels of a first line, the progressive scan method simultaneously writes data to pixels of a second line and then simultaneously writes data to pixels of a third line. Hence, the progressive scan method writes in sequence data to pixels of all lines of the display panel. In order to implement the progressive scan method, the GIP circuit shifts an output using a shift register and sequentially supplies the gate signal to the gate lines.

Each pixel includes a plurality of subpixels having different colors for color implementation, and each subpixel includes a transistor used as a switching element or a driving element. The transistor may be implemented as a thin film transistor (TFT). The GIP circuit supplies the gate signal to a gate of the transistor formed in each pixel to turn on or off the transistor.

Each pixel circuit of the active area includes a plurality of transistors. Gate signals having different waveforms may be applied to the plurality of transistors. The display device requires as many GIP circuits as the number of gate signals applied to the pixel circuit. Each GIP circuit includes a shift register, and lines receiving a start pulse, a clock, etc. for controlling the shift register are required.

Two or more gate signals having different phases may be applied to the pixel circuit. When a gate signal having an inverted phase of another gate signal is generated, an inverter circuit is connected to an output node of the GIP circuit and inverts an output signal of the GIP circuit. For example, when a scan signal and an emission signal (hereinafter referred to as "EM signal") are applied to the pixel circuit, the GIP circuit includes a first GIP circuit generating the scan signal, and a second GIP circuit and the inverter outputting the EM signal. The GIP circuit is disposed in a bezel area outside the active area in which an image is displayed on the substrate of the display panel. Because a size of the bezel area occupying the display panel increases as the size of the GIP circuit increases, a narrow bezel cannot be implemented.

The shift of the gate signal needs to be irregularly changed for the vertical active time depending on a method for driving the pixels. In this instance, a shift register of an existing GIP circuit generates an output in accordance with clock timing having a predetermined cycle. Therefore, it is difficult to output the gate signal to any line of the display panel for the vertical active time using output methods other than the progressive scan method irrespective of the clock timing.

SUMMARY

Accordingly, embodiments of the present disclosure are directed to a gate driver circuit and a display device using the same that substantially obviate one or more of the problems due to limitations and disadvantages of the related art.

An object of the present disclosure is to provide a gate driver circuit capable of changing a method for outputting a gate signal to any line of a display panel during a progressive scan process and a display device using the gate driver circuit.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a gate driver circuit comprises a first transistor configured to supply a start signal to a Q node in response to a clock, a second transistor configured to adjust a gate voltage of the first transistor in response to the clock, a third transistor configured to adjust a gate voltage of the second transistor in response to the start signal, a fourth transistor turned on depending on a voltage of the Q node and configured to change a voltage of a QB node, a fifth transistor configured to switch a current path between the first transistor and the Q node in response to a first line control signal, a sixth transistor turned on depending on the voltage of the Q node and configured to supply a gate-off voltage to an output node, a seventh transistor turned on depending on the voltage of the QB node and configured to supply a gate-on voltage to the output node, an eighth transistor configured to supply a second line control signal to the QB node in response to a line designation signal indicating a location of a specific line, and a ninth transistor configured to switch a current path between the second transistor and the QB node in response to a third line control signal, wherein the first to third line control signals are generated independently of the start signal and the clock. Thus, a method for outputting a gate signal to any line of a display panel during a progressive scan process can be changed.

In another aspect, a display device comprises a pixel array including data lines, gate lines, and subpixels, a data driver configured to supply a data signal of an input image to the data lines, and a gate driver configured to supply a gate signal to the gate lines through an output node, wherein a pixel circuit included in each subpixel includes one or more n-type transistors and one or more p-type transistors, wherein the gate driver includes a first transistor configured to supply a start signal to a Q node in response to a clock, a second transistor configured to adjust a gate voltage of the first transistor in response to the clock, a third transistor configured to adjust a gate voltage of the second transistor in response to the start signal, a fourth transistor turned on depending on a voltage of the Q node and configured to change a voltage of a QB node, a fifth transistor configured to switch a current path between the first transistor and the Q node in response to a first line control signal, a sixth transistor turned on depending on the voltage of the Q node and configured to supply a gate-off voltage to the output node, a seventh transistor turned on depending on the voltage of the QB node and configured to supply a gate-on voltage to the output node, an eighth transistor configured to supply a second line control signal to the QB node in response to a line designation signal indicating a location of a specific line, and a ninth transistor configured to switch a current path between the second transistor and the QB node in response to a third line control signal, wherein the first to third line control signals are generated independently of the start signal and the clock. Thus, a method for outputting a gate signal to any line of a display panel during a progressive scan process can be changed.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Figure 1:
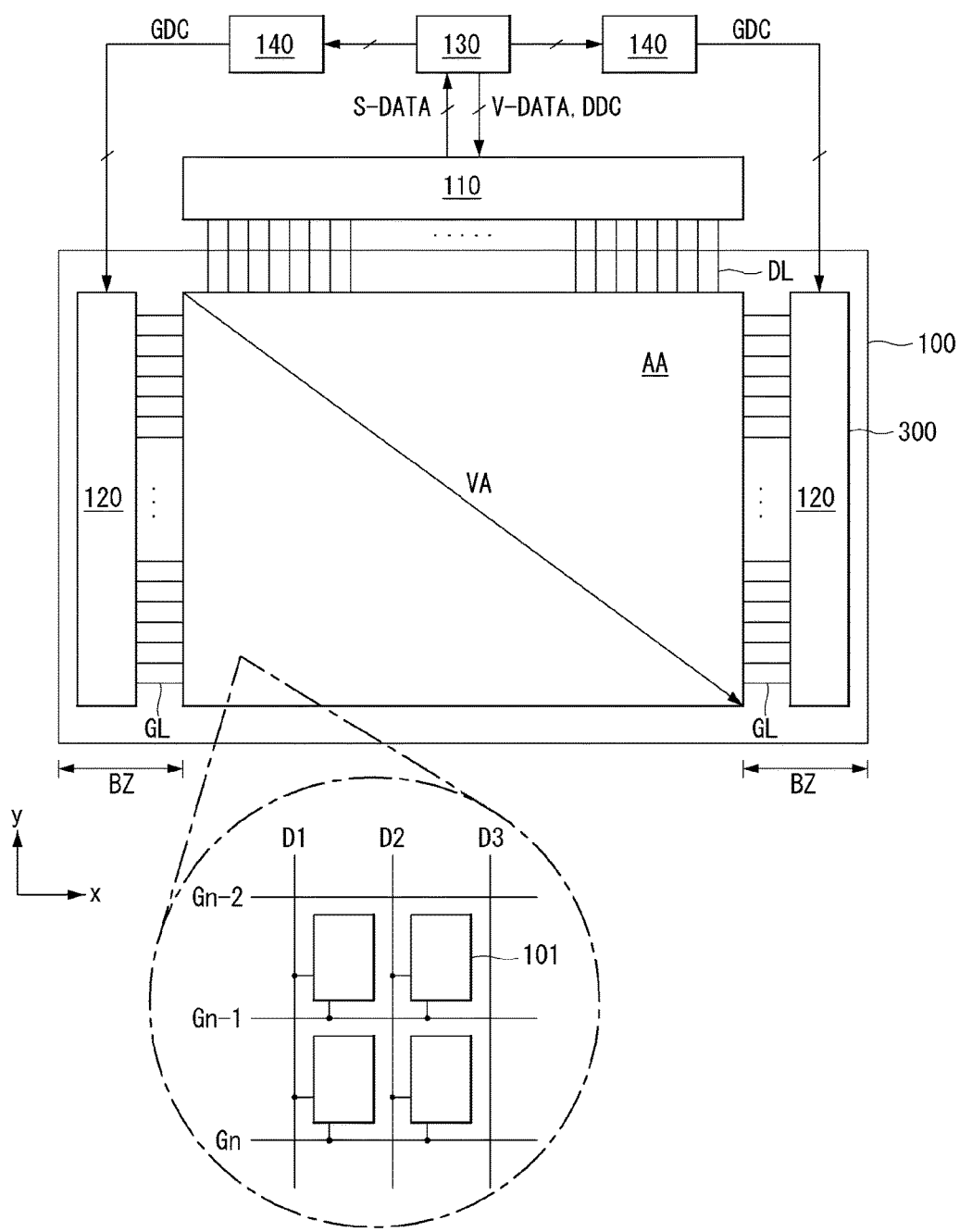
FIG. 1 is a block diagram of a display device according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout. In the following description, when a detailed description of certain functions or configurations related to this document that may unnecessarily cloud the gist of the invention have been omitted.

In the present disclosure, when the terms "include", "have", "comprised of", etc. are used, other components may be added unless "~ only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above", "under or below", "next to" another structure, this description should be construed as including a case in which the structures directly contact each other as well as a case in which a third structure is disposed therebetween.

The terms "first", "second", etc. may be used to distinguish various components. However, functions or structures of the components are not limited by names of the components and ordinal numbers prefixed to the component names.

The features of embodiments of the disclosure can be partially combined or entirely combined with each other, and can be technically interlocking-driven in various ways. The embodiments can be independently implemented, or can be implemented in conjunction with each other.

In embodiments of the disclosure disclosed herein, a GIP circuit and a pixel circuit each include a plurality of transistors. The transistors may be implemented as transistors of a metal oxide semiconductor field effect transistor (MOSFET) structure. The transistors may be an oxide TFT including oxide semiconductor or a low-temperature polycrystalline silicon (LTPS) TFT including LTPS. The oxide TFT may be implemented as an n-type TFT (or an n-type MOSFET (NMOS)), and the LTPS TFT may be implemented as a p-type TFT (or a p-type MOSFET (PMOS)). In each of the GIP circuit and the pixel circuit, both the n-type TFT (or NMOS) and the p-type TFT (or PMOS) may be used.

The MOSFET is a three-electrode element including a gate, a source, and a drain. The source is an electrode for supplying carriers to the MOSFET. The carriers inside the MOSFET begin to flow from the source. The drain is an electrode from which the carriers exit the MOSFET. Namely, carriers in the MOSFET flow from the source to the drain. In case of the n-type TFT, because carriers are electrons, a source voltage is less than a drain voltage so that electrons can flow from a source to a drain. In the n-type TFT, because electrons flow from the source to the drain, a current flows from the drain to the source. In case of the p-type MOSFET, because carriers are holes, a source voltage is greater than a drain voltage so that holes can flow from a source to a drain. In the p-type TFT, because holes flow from the source to the drain, a current flows from the source to the drain. In embodiments disclosed herein, it should be noted that the source and the drain of the TFT are not fixed. For example, the source and the drain of the TFT may be changed depending on an applied voltage. Thus, the present disclosure is limited by the source and the drain of the TFT. In the following description, the source and the drain of the TFT are referred to as a first electrode and a second electrode, respectively.

A gate signal output from the GIP circuit swings between a gate-on voltage and a gate-off voltage. The gate-on voltage is set to a voltage greater than a threshold voltage of a TFT, and the gate-off voltage is set to a voltage less than the threshold voltage of the TFT. The TFT is turned on in response to the gate-on voltage and is turned off in response to the gate-off voltage.

In the following embodiments, an organic light emitting diode (OLED) display including an organic light emitting material is described as an example of an electroluminescent display. However, it should be noted that the technical idea of the present disclosure is not limited to the OLED display. For example, the present disclosure may be applied to a digital flat panel display requiring a gate driver circuit, a liquid crystal display requiring a gate driver circuit, or a quantum display requiring a gate driver circuit without any significant change.

Figure 2:
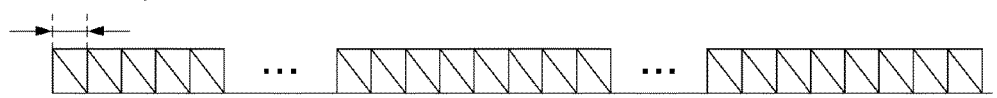
FIG. 2 illustrates a driving frequency of pixels in a normal driving mode and a low power consumption mode.
Figure 2:
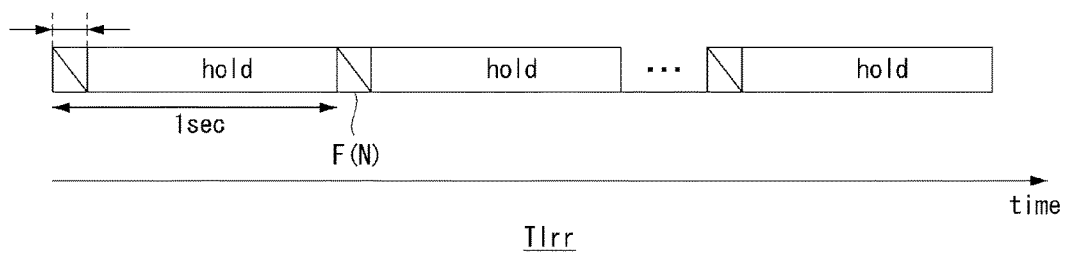

FIG. 1 is a block diagram of a display device according to an embodiment of the disclosure. FIG. 2 illustrates a driving frequency of pixels in a normal driving mode and a low power consumption mode.

Referring to FIGS. 1 and 2, a display device according to an embodiment of the disclosure includes a display panel 100 and a display panel driving circuit.

The display panel 100 includes an active area AA displaying data of an input image. A pixel array is disposed in the active area AA. The pixel array includes a plurality of data lines DL, a plurality of gate lines GL intersecting the data lines DL, and pixels arranged in a matrix. In addition to the matrix, the pixels may be arranged in various shapes including a shape sharing pixels emitting light of the same color, a stripe shape, a diamond shape, and the like.

Each pixel may include a red subpixel, a green subpixel, and a blue subpixel for color implementation. Each pixel may further include a white subpixel. Each subpixel 101 includes a pixel circuit. In case of an electroluminescent display, the pixel circuit includes a light emitting element, a plurality of TFTs, and a capacitor. The pixel circuit is connected to the data line DL and the gate line GL. In FIG. 1, "D1 to D3" denote the data lines, and "Gn−2 to Gn denote the gate lines.

Touch sensors may be disposed on the display panel 100. A touch input may be sensed using separate touch sensors or sensed through the pixels. The touch sensors may be implemented as on-cell touch sensors or add-on touch sensors and disposed on a screen of the display panel 100. Alternatively, the touch sensors may be implemented as in-cell touch sensors that are embedded in the pixel array.

The display panel driving circuit includes a data driver 110 and a GIP circuit 120. The display panel driving circuit writes data of an input image to the pixels of the display panel 100 under the control of a timing controller 130 (or denoted by "TCON").

The display panel driving circuit may operate in a low refresh driving mode Tlrr. The low refresh driving mode Tlrr may be set to reduce power consumption of the display device when there is no change in an input image during a predetermined number of frames as a result of the analysis of the input image. In other words, the low refresh driving mode Tlrr can increase a data writing cycle of the pixels by reducing a refresh rate of the pixels when a still image is input for a predetermined time or more, thereby reducing the power consumption of the display device. The low refresh driving mode Tlrr is not limited to when the still image is input. For example, the display panel driving circuit can operate in the low refresh driving mode Tlrr when the display device operates in a standby mode or when a user command or an input image is not input to the display panel driving circuit for a predetermined time or more.

In a normal driving mode Tnor, the data driver 110 converts digital data DATA of an input image received from the timing controller 130 into a data voltage in each frame and then supplies the data voltage to the data lines DL. The data driver 110 outputs the data voltage using a digital-to-analog converter (DAC) that converts digital data into a gamma compensation voltage. In the low refresh driving mode Tlrr, a driving frequency of the data driver 110 is reduced under the control of the timing controller 130. For example, the data driver 110 outputs the data voltage of the input image in each frame period in the normal driving mode Tnor. In the low refresh driving mode Tlrr, the data driver 110 outputs the data voltage of the input image in some frame periods and does not generate an output in remaining frame periods. Thus, a driving frequency and power consumption of the data driver 110 in the low refresh driving mode Tlrr can be reduced compared to the normal driving mode Tnor.

The data driver 110 outputs the data voltage to be supplied to the pixels of all lines of the display panel 100 for a vertical active time VA. When the pixel array of the display panel 100 includes N*M pixels, the display panel 100 includes M data lines DL. The data voltage may be divided into a display data voltage and a sensing data voltage. The display data voltage is a data voltage of the input image. The sensing data voltage is a data voltage for sensing electrical characteristics of the subpixel. The sensing data voltage is a specific voltage that is previously set regardless of data of the input image.

The GIP circuit 120 may be formed in a bezel area BZ of the display panel 100 on which an image is not displayed. The GIP circuit 120 outputs a gate signal under the control of the timing controller 130 and selects pixels charged with the data voltage through the gate lines GL. The GIP circuit 120 outputs the gate signal and shifts the gate signal using one or more shift registers. For the vertical active time VA, the GIP circuit 120 sequentially supplies a gate signal to gate lines at predetermined shift timing and shifts the gate signal up to a nth gate line (or specific gate line), where n is a positive integer, and then temporarily holds a voltage of the nth gate line in response to a line control signal. Subsequently, the GIP circuit 120 supplies an another gate signal to the nth gate line and then shifts the gate signal to sequentially supply to remaining gate lines at the predetermined shift timing. Thus, for the vertical active time VA, first and second gate signals are applied to only the nth gate line at an interval of a predetermined holding time, and one gate signal is applied to gate lines other than the nth gate line.

A driving frequency of the GIP circuit 120 can be reduced in the low refresh driving mode Tlrr under the control of the timing controller 130. Thus, the driving frequency and power consumption of the GIP circuit 120 in the low refresh driving mode Tlrr can be reduced compared to the normal driving mode Tnor.

The timing controller 130 receives digital video data DATA of an input image and timing signals synchronized with the digital video data DATA from a host system. The timing signals include a vertical sync signal Vsync, a horizontal sync signal Hsync, a data enable signal DE, a clock signal DCLK, and the like. The host system may be one of a television, a set-top box, a navigation system, a personal computer (PC), a home theater, a mobile device, a wearable device, and other systems that include or operate in conjunction with a display device. In the mobile device and the wearable device, the data driver 110, the timing controller 130, level shifters 140, and the like may be integrated into one driver integrated circuit (IC).

The timing controller 130 includes a low refresh driving control module reducing a driving frequency of the display panel driving circuit (110 and 120). As described above, the low refresh driving mode Tlrr is not limited to the still image.

In the normal driving mode Tnor, the timing controller 130 multiplies an input frame frequency by "i" and can control operation timing of the display panel driving circuit (110 and 120) at a frame frequency of (input frame frequency×i) Hz, where "i" is a positive integer greater than zero. The input frame frequency is 50 Hz in a phase alternate line (PAL) method and is 60 Hz in a national television standards committee (NTSC) method.

The timing controller 130 reduces the driving frequency of the display panel driving circuit (110 and 120) in the low refresh driving mode Tlrr. For example, the timing controller 130 can reduce the driving frequency of the display panel driving circuit (110 and 120) to about 1 Hz so that data is written to the pixels once per second. A frequency of the low refresh driving mode Tlrr is not limited to 1 Hz. Thus, the pixels of the display panel 100 are not charged with a new data voltage and can hold the data voltage, which has been already charged, for most of the time in the low refresh driving mode Tlrr.

The timing controller 130 generates a data timing control signal DDC for controlling operation timing of the data driver 110 and a gate timing control signal GDC for controlling operation timing of the GIP circuit 120 based on the timing signals Vsync, Hsync, DE, and DCLK received from the host system.

The level shifter 140 converts voltages of the gate timing control signal GDC output from the timing controller 130 into the gate-on voltage and the gate-off voltage and supplies them to the GIP circuit 120. A low level voltage of the gate timing control signal GDC is converted into a gate low voltage VGL, and a high level voltage of the gate timing control signal GDC is converted into a gate high voltage VGH.

In case of an n-type TFT, the gate-on voltage may be the gate high voltage VGH, and the gate-off voltage may be the gate low voltage VGL. In case of a p-type TFT, the gate-on voltage may be the gate low voltage VGL, and the gate-off voltage may be the gate high voltage VGH.

The gate timing control signal GDC includes a start pulse VST, a shift clock CLK, and the like. The start pulse VST is early generated once in each frame period and is input to the GIP circuit 120. The start pulse VST controls start timing of the GIP circuit 120 in each frame period. The shift clock CLK controls shift timing of the gate signal output from the GIP circuit 120.

Figure 3:
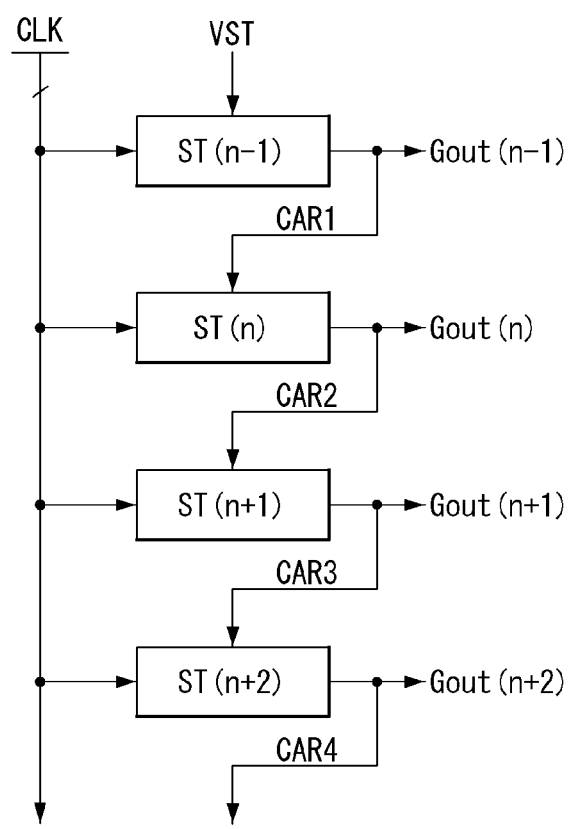
FIG. 3 schematically illustrates a circuit configuration of a shift register of a GIP circuit.
Figure 7:
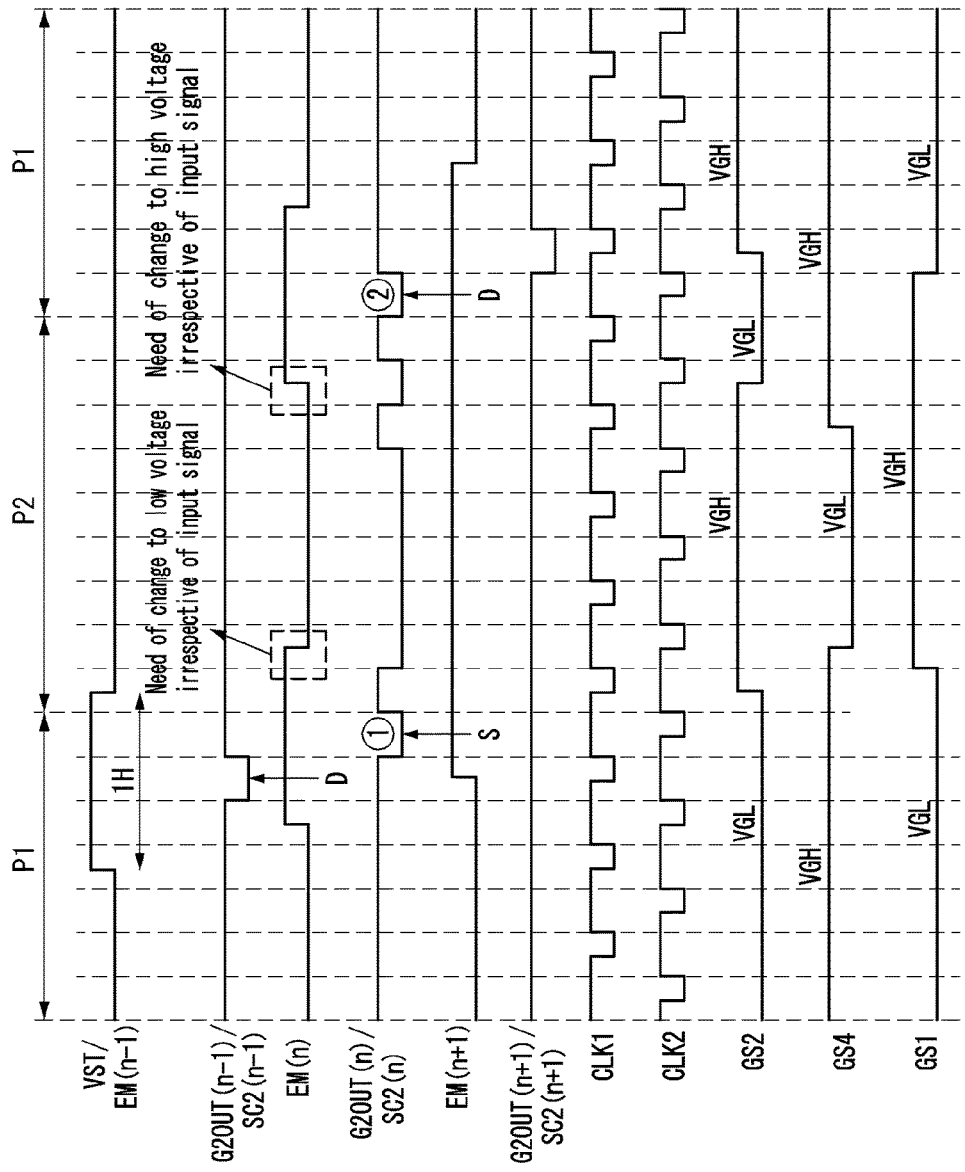
FIG. 7 illustrates an input and output waveform of a circuit shown in FIG. 6.

FIG. 3 schematically illustrates a circuit configuration of a shift register of the GIP circuit 120. A shift register of the GIP circuit 120 includes cascade-connected stages ST(n−1) to ST(n+2). The shift register receives the start pulse VST or carry signals CAR1 to CAR4 received from a previous stage as the start pulse and generates outputs Gout(n−1) to Gout (n+2) in accordance with clock timing. In the following description, a start signal indicates the start pulse VST or the carry signals CAR1 to CAR4 that are generated by a previous stage and are applied to a start signal input terminal of a current stage. In FIG. 7, "EM(n−1)" is a carry signal that is output from a (n−1)th stage and is input to an nth stage.

Figure 4A:
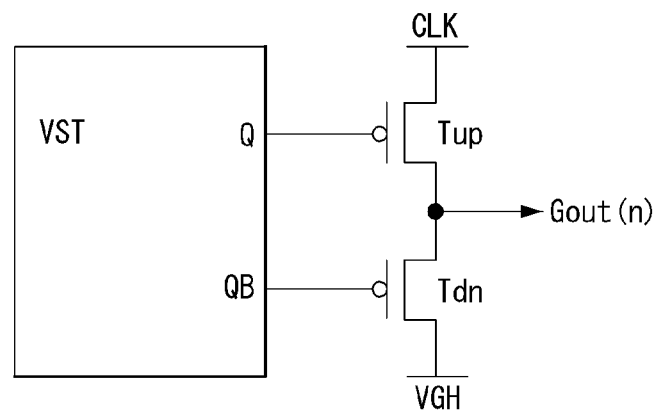
FIGS. 4A and 4B schematically illustrate a pass gate circuit and an edge trigger circuit.
Figure 4B:
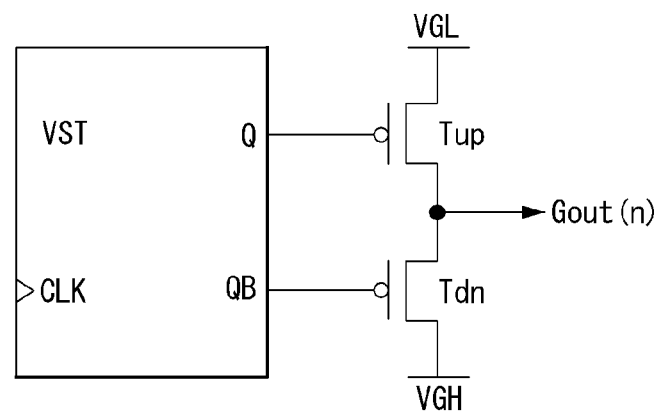

The stage may be implemented as a pass-gate circuit shown in FIG. 4A or an edge trigger circuit shown in FIG. 4B.

In the pass-gate circuit, a clock CLK is input to a pull-up transistor Tup that is turned on or off depending on a voltage of a Q node. In the edge trigger circuit, the gate-on voltage VGL is supplied to a pull-up transistor Tup, and a start signal VST and the clock CLK are input. A pull-down transistor Tdn is turned on or off depending on a voltage of a QB node.

In the pass-gate circuit, the Q node is floated in a state of being pre-charged in response to the start signal. When the clock CLK is applied to the pull-up transistor Tup in the floated state of the Q node, the voltage of the Q node increases due to bootstrapping. Hence, a voltage of an output signal Gout(n) is changed to the gate-on voltage.

In the edge trigger circuit, a voltage of an output signal Gout(n) is changed in synchronization with an edge of the clock CLK, and a waveform having the same phase as the start signal is output. In the edge trigger circuit, an input signal overlaps the output signal Gout(n). When a waveform of the start signal is changed, a waveform of the output signal Gout(n) is changed depending on change in the waveform of the start signal.

It is difficult for the pass-gate circuit to generate an output signal having an inverted phase of an input signal. For example, when transistors of the pass-gate circuit are implemented as p-type TFTs, the pass-gate circuit can output a gate-on voltage waveform for the p-type transistor. When the transistors of the pass-gate circuit are implemented as the p-type TFTs, the pass-gate circuit further requires an inverter circuit for inverting a voltage of an output node, in order to output a gate-on voltage waveform of an n-type TFT. A method for inverting a phase of the clock signal input to the pass-gate circuit may be considered. However, in this instance, the voltage of the Q node is not boosted because the bootstrapping is not performed. Therefore, a desired output waveform cannot be obtained.

Figure 6:
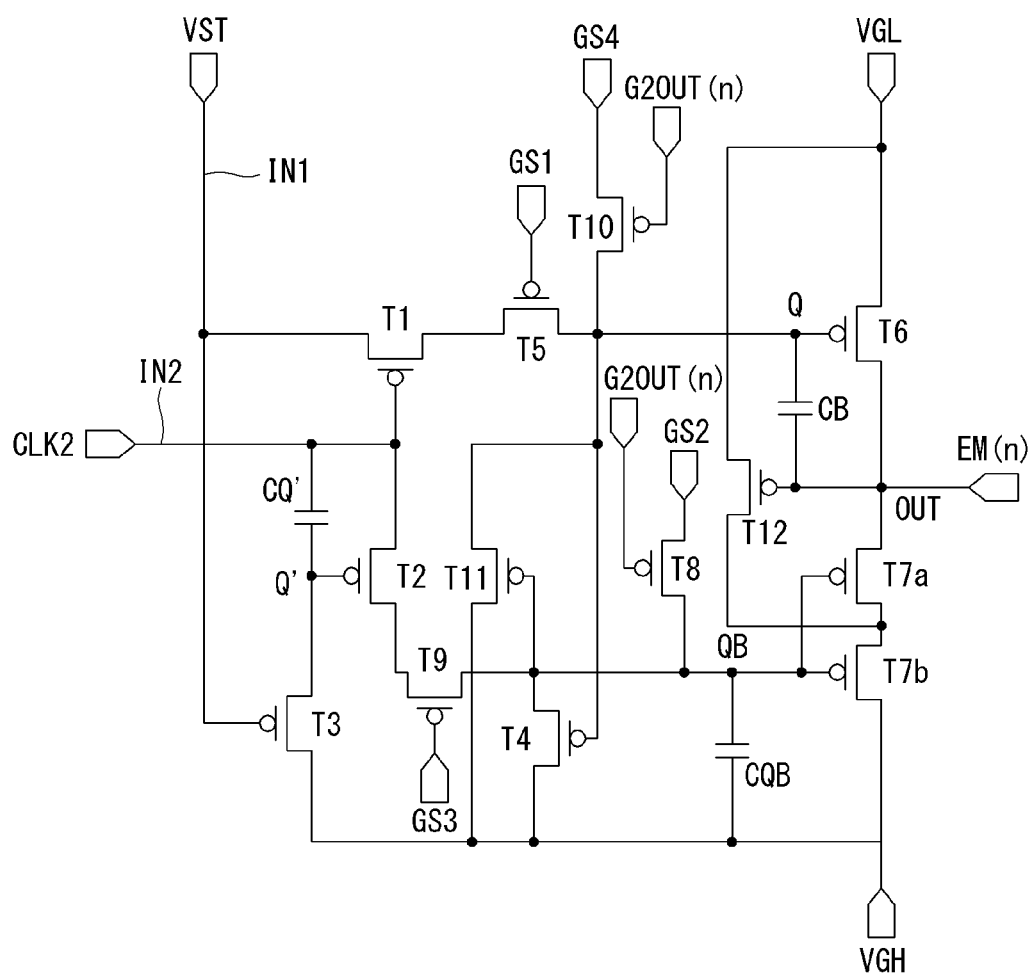
FIG. 6 illustrates in detail a GIP circuit according to an embodiment of the disclosure.

The edge trigger circuit may generate an output signal having an inverted phase of clock as an input signal. An example of the edge trigger circuit proposed in embodiments of the disclosure is shown in FIG. 6. As shown in FIGS. 6 and 7, when transistors of the edge trigger circuit are implemented as p-type TFTs, the edge trigger circuit can obtain a gate-on voltage waveform of n-type TFTs. The GIP circuit according to embodiments of the disclosure is implemented based on the edge trigger circuit and further includes a circuit that changes a phase of a gate signal or temporarily holds the gate signal in response to a line control signal for a vertical active time irrespective of the input signal.

In case of an electroluminescent display, an internal compensation method or an external compensation method may be applied to reduce degradation of subpixels and increase lifespan of the subpixels. Because electrical characteristics of pixels including a threshold voltage Vth and electron mobility μ of a driving element, a threshold voltage of an OLED, etc. are factors determining a driving current Ids, all the pixels have to have the same electrical characteristics. However, there may be a variation in the electrical characteristics between the pixels due to various causes including a process variation, changes over time, etc. The variation in the electrical characteristics between the pixels may result in a reduction in image quality and lifespan.

The internal compensation method samples a gate-to-source voltage of the driving element using a compensation circuit disposed inside a pixel circuit and senses a threshold voltage of a subpixel driving element, thereby compensating for a data voltage with the sensed threshold voltage. The external compensation method senses a voltage of a pixel, that is changed depending on electrical characteristics of the driving element, through a sensing path connected to the subpixel and modulates data of an input image based on the sensed voltage using an external circuit outside the pixel array, thereby compensating for changes in the electrical characteristics of the driving element.

In a sensing mode for measuring a variation in electrical characteristics of the subpixels before shipment or during product operation, the data driver 110 generates a sensing data voltage and supplies the sensing data voltage to subpixels 101 to be sensed of the display panel 100 through the data lines DL.

Figure 5A:
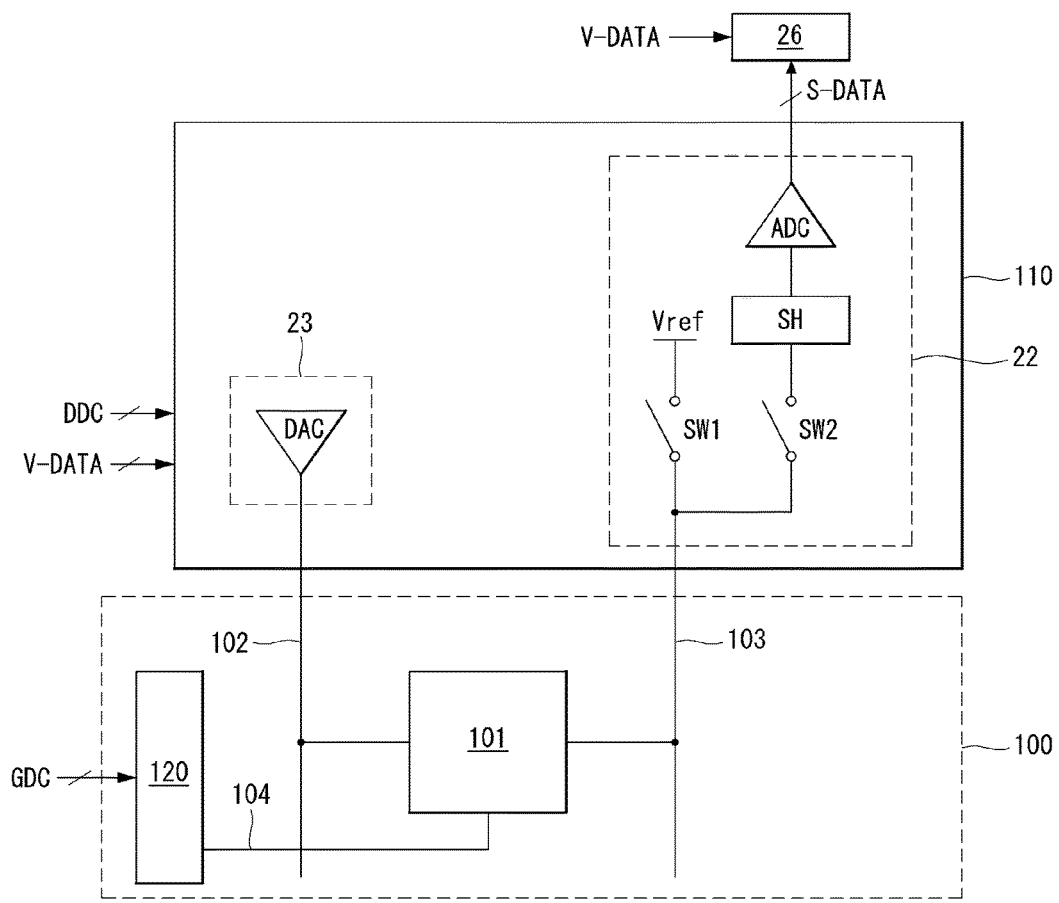
FIGS. 5A and 5B illustrate a sensing path connected to a subpixel.
Figure 5B:
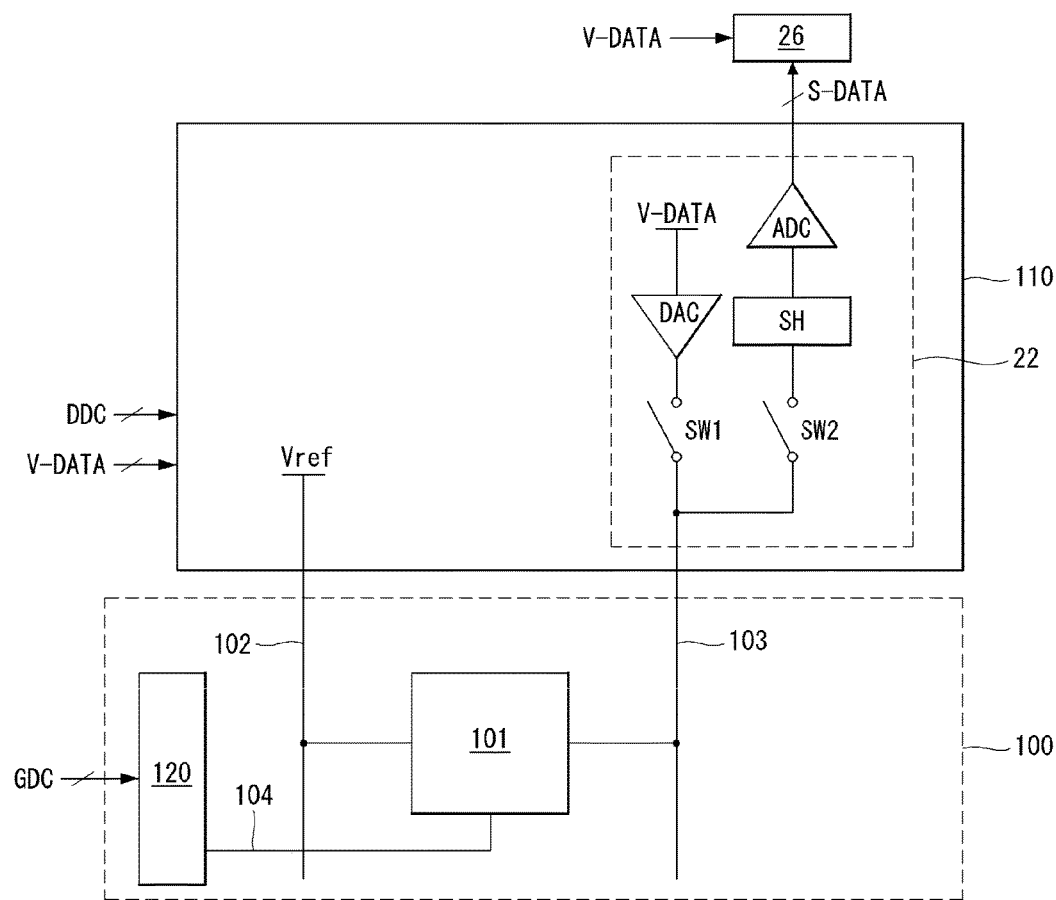

FIGS. 5A and 5B illustrate a sensing path connected to a subpixel for implementation of an external compensation method.

Referring to FIG. 5A, the data driver 110 includes a sensing unit 22 connected to a sensing path and a data voltage generator 23. The sensing path includes a data line 102 or 103 connected to the subpixel 101, switching elements SW1 and SW2, a sample and hold circuit SH, an analog-to-digital converter (ADC), and the like.

The data voltage generator 23 generates a data voltage through a DAC and supplies the data voltage to the first data line 102. When a gate signal synchronized with the data voltage is supplied to a gate line 104, the data voltage is supplied to the subpixel 101. The data voltage includes a display data voltage and a sensing data voltage.

The sensing unit 22 is connected to the subpixel 101 through the second data line 103. The sensing unit 22 includes the sample and hold circuit SH, the ADC, and the first and second switching elements SW1 and SW2. The sensing unit 22 samples a voltage of the second data line 103 changing depending on a current of a driving element and thus can sense electrical characteristics of the driving element. The first switching element SW1 supplies the second data line 103 with a predetermined reference voltage Vref for initializing the subpixel 101 and the second data line 103. When a voltage of the nth gate line (or the specific gate line) is held for a predetermined sensing time, the second switching element SW2 is turned on and connects the second data line 103 to the sample and hold circuit SH. The subpixels 101 to be sensed are connected to the nth gate line. A location of the nth gate line may be changed every frame period or every predetermined time so that all the subpixels of the display panel 100 can be sensed.

The sample and hold circuit SH samples and holds an analog sensing voltage of the subpixel 101 charged to the second data line 103. The ADC converts the analog sensing voltage of the subpixel 101 sampled by the sample and hold circuit SH into digital sensing data S-DATA. The sensing unit 22 may be implemented as a known voltage sensing circuit or a known current sensing circuit. The digital sensing data S-DATA output from the sensing unit 22 is transmitted to a compensation unit 26 of the timing controller 130.

The compensation unit 26 adds or multiplies a compensation value set in a lookup table to video data V-DATA of an input image depending on a sensing value of the subpixel 101 and modulates the video data V-DATA, thereby compensating for changes in electrical characteristics of the subpixel 101. The lookup table receives the digital sensing data S-DATA and the video data V-DATA of the input image as a memory address and outputs the compensation value stored in the memory address. The video data V-DATA modulated by the compensation unit 26 is transmitted to the data voltage generator 23. The modulated video data V-DATA is converted into the display data voltage by the data voltage generator 23 and is supplied to the first data line 102.

As shown in FIG. 5B, the sensing unit 22 may supply a video data voltage of the input image to the second data line 103, and the reference voltage Vref may be applied to the first data line 102.

FIG. 6 illustrates in detail a GIP circuit according to an embodiment of the disclosure. A GIP circuit shown in FIG. 6 is an nth stage circuit. Transistors shown in FIG. 6 may be implemented as p-type TFT, by way of example. However, embodiments are not limited thereto. FIG. 7 illustrates an input and output waveform of a circuit shown in FIG. 6. The GIP circuit shown in FIG. 6 may generate a scan signal or an EM signal. An operation of the GIP circuit shown in FIGS. 6 and 7 is described using an operation of outputting the EM signal as an example. However, embodiments are not limited thereto. For example, the GIP circuit shown in FIGS. 6 and 7 may output the scan signal.

Referring to FIGS. 6 and 7, an nth stage of the GIP circuit 120 includes a plurality of TFTs T1 to T12 and a plurality of capacitors CQ', CB and CQB.

The nth stage includes a VST node IN1 to which a start signal VST/EM(n−1) is input, a CLK node IN2 to which a clock CLK2 is input, GS nodes to which first to fourth line control signals GS1 to GS4 are input, a G2OUT node to which G2OUT(n) is input, a VGH node to which a gate-off voltage VGH is applied, a VGL node to which a gate-on voltage VGL is applied, and an output node OUT to which an nth EM signal EM(n) is output. The output node OUT is an nth EM signal line connected to subpixels of an nth line of the display panel 100 to which the nth EM signal EM(n) is applied. The nth EM signal line corresponds to the above-described the nth gate line.

In FIGS. 6 and 7, "G2OUT(n)" is a signal indicating a location of the nth gate line and is a line designation signal indicating a location of the nth EM signal line. The G2OUT (n) may be a second scan signal SC2(n) shown in FIG. 8 and FIG. 9. However, embodiments are not limited thereto.

An operation of the GIP circuit 120 may be divided into a progressive scan time and a hold time for a vertical active time. Hereinafter, the progressive scan time is referred to as a first period P1, and the hold time is referred to as a second period P2. In the second period P2, a gate signal at the nth line of the display panel 100 is not shifted, and characteristics of a TFT or an OLED can be sensed or the nth line can operate as a black data insertion (BDI) line. The nth line of the display panel 100 is a line at which the nth EM signal EM(n) is held at the gate-on voltage VGL during the second period P2. The second period P2 may be set to time between one horizontal period 1H and two horizontal periods 2H. However, embodiments are not limited thereto. The second period P2 may be properly set according to time required to sense one line of the display panel 100.

FIG. 7 illustrates an example where the operation of the GIP circuit 120 is divided into the first period P1, the second period P2, and the first period P1. In FIG. 7, "CLK1" is a clock synchronized with a (n−1)th EM signal EM(n−1), and "CLK2" is a clock synchronized with the nth EM signal EM(n).

The timing controller 130 may generate the line control signals GS1 to GS4 independently of the start signal VST and the clocks CLK1 and CLK2. The line control signals GS1 to GS4 are generated by the timing controller 130 and may be simultaneously applied to all the subpixels through the level shifter 140. At an edge timing at which the second line control signal GS2 is inverted to the gate-on voltage VGL, a voltage of a QB node QB is changed to the gate-on voltage VGL, and the nth EM signal EM(n) is changed to the gate-off voltage VGH. The second line control signal GS2 is generated at the gate-off voltage VGL during the first period P1 and then is inverted to the gate-off voltage VGH before the fourth line control signal GS4 is inverted to the gate-on voltage VGL. The second line control signal GS2 is held at the gate-off voltage VGH during the second period P2.

When the fourth line control signal GS4 is inverted to the gate-on voltage VGL, a voltage of a Q node Q is changed to the gate-on voltage VGL. In this instance, the nth EM signal EM(n) is changed to the gate-on voltage VGL. The fourth line control signal GS4 is generated at the gate-off voltage VGH during the first period P1.

The first line control signal GS1 is generated at the gate-on voltage VGL during the first period P1 and then is inverted to the gate-off voltage VGH before the fourth line control signal GS4 is inverted from the gate-off voltage VGH to the gate-on voltage VGL. The first line control signal GS1 is held at the gate-off voltage VGH during the second period P2. The first line control signal GS1 is inverted to the gate-on voltage VGL before the second line control signal GS2 is inverted to the gate-off voltage VGH. The first line control signal GS1 is inverted to the gate-off voltage VGH after the second line control signal GS2 is inverted from the gate-on voltage VGL to the gate-off voltage VGH. The first line control signal GS1 blocks a current path between the VST node IN1 and the Q node Q during the second period P2, so that a voltage of the nth EM signal EM(n) is not changed by the start signal VST/EM(n−1).

A rising edge of the nth EM signal EM(n) is synchronized with a falling edge timing of the second line control signal GS2 which changes from the gate-off voltage VGH to the gate-on voltage VGL. A falling edge of the nth EM signal EM(n) is synchronized with a falling edge timing of the fourth line control signal GS4 which changes from the gate-off voltage VGH to the gate-on voltage VGL. Thus, the second period P2 can be adjusted depending on the edge timings of the second and fourth line control signals GS2 and GS4 irrespective of an input signal of the edge trigger circuit.

As shown in FIG. 7, the line control signals GS1, GS2 and GS4 control the voltage of the Q node Q and the voltage of the QB node QB irrespective of the input signals VST and CLK2. As a result, in a progressive scan process in which a voltage of an output signal (i.e., the nth EM signal EM(n)) is scanned in sequence, the voltage of the nth EM signal EM(n) can be held at the gate-on voltage VGL during one horizontal period 1H or more in the second period P2. A rising edge timing and a falling edge timing of the nth EM signal EM(n) are controlled in accordance with the edge timings of the line control signals GS2 and GS4. Thus, because the second period P2 can be adjusted by controlling the edge timings of the line control signals GS2 and GS4 generated by the timing controller 130, a designer can control a real-time sensing time, a BDI time or etc. of the subpixel irrespective of an input signal of the GIP circuit.

Embodiments of the disclosure can minutely adjust a luminance of each line using the third line control signal GS3 when there is a luminance difference between the lines of the display panel 100, thereby improving the luminance difference between the lines. The third line control signal GS3 can control the voltage of the QB node QB so that the voltage of the QB node QB is not changed by the start signal and the clock.

The third line control signal GS3 may be used to increase a luminance of subpixels of the lines subsequent to the nth line which do not emit light during the second period P2. When the third line control signal GS3 is generated at the gate-off voltage VGH, the voltage of the QB node QB increases. Hence, because a time at which the voltage of the nth EM signal EM(n) is inverted to the gate-off voltage VGH is delayed, the luminance difference resulting from the second period P2 can be compensated by increasing an emission time of the subpixels 101.

The first and fifth TFTs T1 and T5 connect the VST node IN1 to the Q node Q in response to the clock CLK2 and supplies the Q node Q with the start signal VST/EM(n−1) input through the VST node IN1 during the first period P1. The first TFT T1 is turned on at an edge timing of the clock CLK2 at which the voltage of the clock CLK2 changes from the gate-off voltage VGH to the gate-on voltage VGL, and connects the VST node IN1 to the Q node Q. In this instance, the voltage of the Q node Q changes to a voltage of the VST node IN1. The first TFT T1 includes a gate connected to the CLK node IN2, a first electrode connected to the VST node IN1, and a second electrode connected to the Q node Q via the fifth TFT T5.

The second TFT T2 is turned on at the same time as the first TFT T1 at an edge timing at which the voltage of the clock CLK2 changes from the gate-on voltage VGL to the gate-off voltage VGH in response to the clock CLK2, and changes the voltage of the QB node QB to the reverse of the voltage of the Q node Q. When the voltage of the VST node IN1 is the gate-off voltage VGH due to the first and second TFTs T1 and T2 at the edge timing of the clock CLK2 at which the voltage of the clock CLK2 changes to the gate-on voltage VGL, the voltage of the Q node Q is the gate-off voltage VGH and the voltage of the QB node QB is the gate-on voltage VGL. When the voltage of the VST node IN1 is the gate-on voltage VGL at the edge timing of the clock CLK2 at which the voltage of the clock CLK2 changes to the gate-on voltage VGL, the voltage of the Q node Q is the gate-on voltage VGL and the voltage of the QB node QB is the gate-off voltage VGH. The second TFT T2 includes a gate connected to a Q' node Q', a first electrode connected to the CLK node IN2 and the gate of the first TFT T1, and a second electrode connected to the QB node QB via the ninth TFT T9. The Q' node Q' is connected to the CLK node IN2 through the third capacitor CQ'.

The third capacitor CQ' is formed between the Q' node Q' and the CLK node IN2. When the voltage of the CLK node IN2 changes due to the third capacitor CQ', a voltage of the gate of the second TFT T2 changes rapidly.

The third TFT T3 holds a voltage of the output node OUT in a previous state when the voltage of the clock CLK2 does not change from the gate-off voltage VGH to the gate-on voltage VGL. For example, when the voltage of the clock CLK2 is the gate-off voltage VGH and the voltage of the VST node IN1 changes from the gate-off voltage VGH to the gate-on voltage VGL, the third TFT T3 is turned on. Hence, the third TFT T3 connects the Q' node Q' to the VGH node and changes a voltage of the Q' node Q' to the gate-off voltage VGH. In this instance, the first and second TFTs T1 and T2 are turned off. The third TFT T3 includes a gate connected to the VST node IN1, a first electrode connected to the Q' node Q', and a second electrode connected to the VGH node.

The fourth TFT T4 includes a gate connected to the Q node Q, a first electrode connected to the QB node QB, and a second electrode connected to the VGH node. When the voltage of the Q node Q is the gate-on voltage VGL, the fourth TFT T4 is turned on and connects the QB node QB to the VGH node.

The twelfth TFT T12 is turned on when the voltage of the Q node Q is the gate-on voltage VGL. Hence, the twelfth TFT T12 supplies a voltage of the VGL node to a node between a second electrode of the 7a TFT T7a and a first electrode of the 7b TFT T7b, thereby turning on the 7a and 7b TFTs T7a and T7b or preventing a leakage current from flowing through the 7a and 7b TFTs T7a and T7b.

The fifth TFT T5 is turned on depending on a gate-on voltage VGL of the first line control signal GS1 in the first period P1. Hence, the fifth TFT T5 connects the first TFT T1 to the Q node Q and changes the voltage of the Q node Q to the voltage of the start signal VST/EM(n−1). Further, the fifth TFT T5 is turned off depending on a gate-off voltage VGH of the first line control signal GS1 in the second period P2. Hence, the fifth TFT T5 blocks a current path between the first TFT T1 and the Q node Q and prevents change in the voltage of the Q node Q resulting from the start signal VST/EM(n−1). The fifth TFT T5 includes a gate supplied with the first line control signal GS1, a first electrode connected to the second electrode of the first TFT T1, and a second electrode connected to the Q node Q. As shown in FIG. 7, a rising edge of the first line control signal GS1 is synchronized with a falling edge of the G2OUT(n), and a falling edge of the first line control signal GS1 is synchronized with a rising edge of the G2OUT(n).

When the voltage of the Q node Q is the gate-on voltage VGL, the sixth TFT T6 is turned on and connects the VGL node to the output node OUT. When the sixth TFT T6 is turned on, the voltage of the output node OUT changes to the gate-on voltage VGL. Hence, the voltage of the nth EM signal EM(n) changes to the gate-on voltage VGL. The sixth TFT T6 includes a gate connected to the Q node Q, a first electrode connected to the VGL node, and a second electrode connected to the output node OUT.

The first capacitor CB is formed between the gate and the second electrode of the sixth TFT T6. The first capacitor CB suppresses a ripple of the output node OUT. Further, when the voltage of the output node OUT changes to the gate-on voltage VGL, the first capacitor CB causes the voltage of the Q node of a floating state to quickly change to the gate-on voltage VGL.

When the voltage of the QB node QB is the gate-on voltage VGL, the seventh TFTs T7a and T7b are turned on and connect the output node OUT to the VGH node. The seventh TFTs T7a and T7b may include two transistors T7a and T7b that are connected to each other in a dual gate structure, in order to reduce the leakage current. However, embodiments are not limited thereto. The 7a TFT T7a includes a gate connected to the QB node QB, a first electrode connected to the output node OUT, and a second electrode connected to a first electrode of the 7b TFT T7b. The 7b TFT T7b includes a gate connected to the QB node QB, the first electrode connected to the second electrode of the 7a TFT T7a, and a second electrode connected to the VGH node. The seventh TFTs T7a and T7b may be implemented as a single transistor including a gate connected to the QB node QB, a first electrode connected to the output node OUT, and a second electrode connected to the VGH node.

The second capacitor CQB may be formed between the QB node QB and the VGH node. The second capacitor CQB suppresses a ripple of the QB node QB.

The tenth TFT T10 maintains an off-state during the first period P1 and changes the voltage of the Q node Q to the voltage of the fourth line control signal GS4 during the second period P2. The tenth TFT T10 includes a gate supplied with the G2OUT(n), a first electrode supplied with the fourth line control signal GS4, and a second electrode connected to the Q node Q. The fourth line control signal GS4 holds the gate-off voltage VGH during the first period P1. When the fourth line control signal GS4 is the gate-off voltage VGH, the tenth TFT T10 maintains an off-state irrespective of a voltage of the G2OUT(n). When the fourth line control signal GS4 and the G2OUT(n) change to the gate-on voltage VGL in the second period P2, the tenth TFT T10 is turned on. Hence, the tenth TFT T10 connects a node of the fourth line control signal GS4 to the Q node and changes the voltage of the Q node to the gate-on voltage VGL. As shown in FIG. 7, when the G2OUT(n) is at the gate-on voltage VGL and the fourth line control signal GS4 is inverted from the gate-off voltage VGH to the gate-on voltage VGL, the tenth TFT T10 is turned on. Hence, the nth EM signal EM(n) is inverted to the gate-on voltage VGL.

The eleventh TFT T11 includes a gate connected to the QB node QB, a first electrode connected to the Q node Q, and a second electrode connected to the VGH node. When the voltage of the QB node QB is the gate-on voltage VGL, the eleventh TFT T11 is turned on and connects the Q node Q to the VGH node.

When the G2OUT(n) is at the gate-on voltage VGL, the eighth TFT T8 is turned on and connects the second line control signal GS2 to the QB node QB. The eighth TFT T8 includes a gate supplied with the G2OUT(n), a first electrode supplied with the second line control signal GS2, and a second electrode connected to the QB node QB. Before the fourth line control signal GS4 is inverted to the gate-on voltage VGL, the second line control signal GS2 is inverted to the gate-off voltage VGH and is held at the gate-off voltage VGH in the second period P2. As shown in FIG. 7, when the second line control signal GS2 is inverted from the gate-off voltage VGH to the gate-on voltage VGL, the nth EM signal EM(n) is inverted to the gate-off voltage VGH.

When a voltage of the third line control signal GS3 is the gate-on voltage VGL, the ninth TFT T9 connects the second electrode of the second TFT T2 to the QB node QB. When the voltage of the third line control signal GS3 is the gate-off voltage VGH, the ninth TFT T9 is turned off and blocks a current path between the CLK node IN2 and the QB node QB. The ninth TFT T9 includes a gate supplied with the third line control signal GS3, a first electrode connected to the second electrode of the second TFT T2, and a second electrode connected to the QB node QB.

The fourth line control signal GS4, the tenth TFT T10, the eleventh TFT T11, and the twelfth TFT T12 may be omitted in the circuit configuration of FIG. 6.

Referring to FIG. 7, during the first period P1 in which the subpixels of the display panel 100 are scanned in sequence, the GIP circuit receives the start signal VST/EM(n−1) and outputs an output signal (i.e., the nth EM signal EM(n)) that is synchronized with the falling edge of the clock CLK2 and has as the same voltage as the voltage of the start signal VST/EM(n−1). The nth EM signal EM(n) is changed to the gate-off voltage VGH at a time at which a predetermined time passed from the rising edge of the start signal VST/EM(n−1) in the first period P1, and is inverted to the gate-on voltage VGL at a time at which a predetermined time passed from the falling edge of the start signal VST/EM(n−1). During the first period P1, the nth EM signal EM(n) is generated at the same waveform as the start signal VST/EM(n−1) and overlaps the start signal VST/EM(n−1).

The second line control signal GS2 is applied to the QB node QB through the eighth TFT T8 during a supply period of the gate-on voltage VGL of the G2OUT(n) and thus can control the voltage of the nth EM signal EM(n) irrespective of the start signal VST/EM(n−1) and the clock CLK2. As can be seen from FIG. 7, the nth EM signal EM(n) is synchronized with the falling edge, at which the clock CLK2 and the second line control signal GS2 change from the gate-off voltage VGH to the gate-on voltage VGL, and is inverted to the gate-off voltage VGH.

The fourth line control signal GS4 is applied to the Q node Q through the tenth TFT T10 during a supply period of the gate-on voltage VGL of the G2OUT(n) and thus can control the voltage of the nth EM signal EM(n) irrespective of the start signal VST/EM(n−1) and the clock CLK2. As can be seen from FIG. 7, the falling edge of the nth EM signal EM(n) is synchronized with the falling edge of the fourth line control signal GS4, at which the fourth line control signal GS4 changes from the gate-off voltage VGH to the gate-on voltage VGL, and is inverted to the gate-on voltage VGL.

The first line control signal GS1 is generated at the gate-off voltage VGH when the nth EM signal EM(n) in the edge trigger circuit needs to be controlled irrespective of the start signal VST/EM(n−1), thereby blocking a current path between the VST node IN1 and the Q node Q. In an example of FIG. 7, the first line control signal GS1 is generated at the gate-off voltage VGH for a predetermined time including the second period P2.

When the clock CLK2 is inverted to the gate-on voltage VGL in a state where the fourth line control signal GS4 is the gate-on voltage VGL, the start signal VST/EM(n−1) and the fourth line control signal GS4 can be simultaneously supplied to the Q node Q. In this instance, when the voltage of the start signal VST/EM(n−1) is opposite to the voltage of the fourth line control signal GS4, the voltage of the Q node Q changes to a middle voltage of the gate-on voltage VGL and the gate-off voltage VGH, resulting in malfunction of the GIP circuit. In order to prevent the malfunction of the GIP circuit, as shown in FIG. 7, the edge timing of the fourth line control signal GS4 and the edge timing of the first line control signal GS1 have to be separated from each other by a predetermined time.

When the voltages of the second and fourth line control signals GS2 and GS4 are simultaneously the gate-on voltage VGL at the edge timings of the second and fourth line control signals GS2 and GS4, the sixth and seventh TFTs T6, T7a and T7b are simultaneously turned on. Hence, the GIP circuit cannot obtain a normal output waveform. In order to prevent this, as shown in FIG. 7, the edge timing of the fourth line control signal GS4 and the edge timing of the first line control signal GS1 have to be separated from each other by a predetermined time.

The nth EM signal EM(n) is held at the gate-on voltage VGL during the second period P2. When the nth EM signal EM(n) is at the gate-on voltage VGL, a current may flow in the driving element of the subpixel 101. Therefore, electrical characteristics of the driving element can be sensed.

In order to sense electrical characteristics of the subpixels 101 disposed on the nth line of the display panel 100 during the second period P2, as shown in FIG. 7, a sensing data voltage S may be applied to the subpixels 101 of the nth line in synchronization with a pulse of the G2OUT(n) before a start of the second period P2. After the second period P2 in which the subpixels 101 are sensed ends, a video data voltage D to be displayed is applied to the subpixels 101. Thus, sensing data and video data are successively written to the subpixels 101 of the nth line at intervals of the second period P2 in one frame period, particularly, the vertical active time VA. Pixels of the display panel 100 are scanned in sequence in the first period P1 to which data is written in the pixels of the display panel 100 other than pixels of the nth line. In FIG. 7, "①" denotes a time at which the sensing data is written to the subpixels 101, and "②" denotes a time at which the video data is written to the subpixels 101.

The GIP circuit 120 according to embodiments of the disclosure blocks the subpixels from emitting light when writing data to the subpixels in the first period P1 in which the progressive scanning is performed using the edge trigger circuit. The EM signal outputted from the edge trigger circuit is inverted as the form of AC signal in accordance with a predetermined pulse width modulation (PWM) duty ratio during an emission period. As shown in FIGS. 6 and 7, the GIP circuit 120 according to embodiments of the disclosure independently controls the EM signal EM(n) using the line control signals GS1, GS2, GS4 irrespective of the input signal of the edge trigger circuit, and thus can sense electrical characteristics of subpixels of a specific line (i.e., the nth line) during the progressive scan process for displaying an input image and can resume the progressive scanning again. The second period P2 controlled by the line control signals GS1, GS2, GS4 is not limited to a sensing operation of the subpixels and may be applied to various driving methods. The third line control signal GS3 controls an emission time of the subpixel by adjusting the EM signal EM(n), thereby compensating for the luminance reduction of the subpixel resulting from the second period P2 and uniformly controlling the luminance of the entire screen of the display panel 100.

Figure 8:
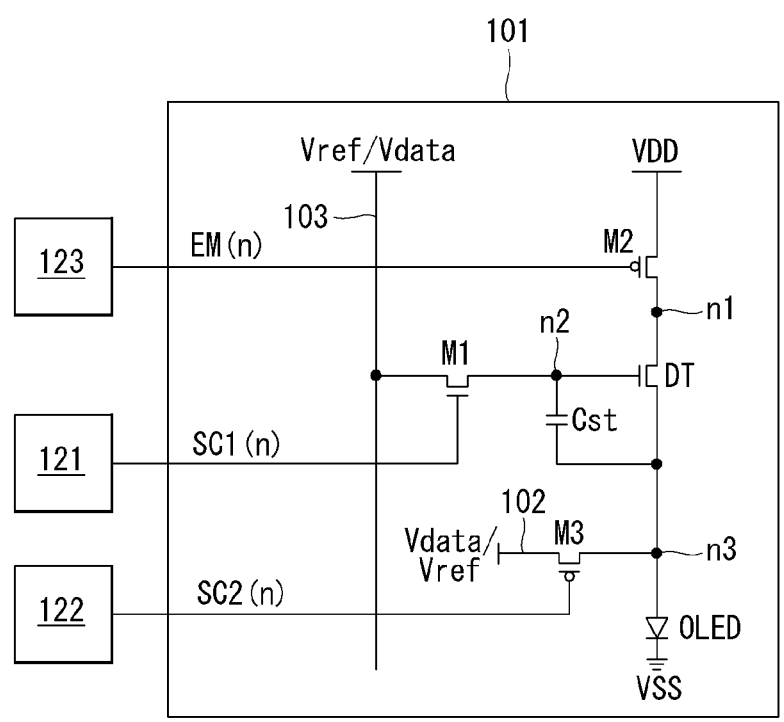
FIG. 8 is a circuit diagram illustrating an example of a pixel circuit.
Figure 9:
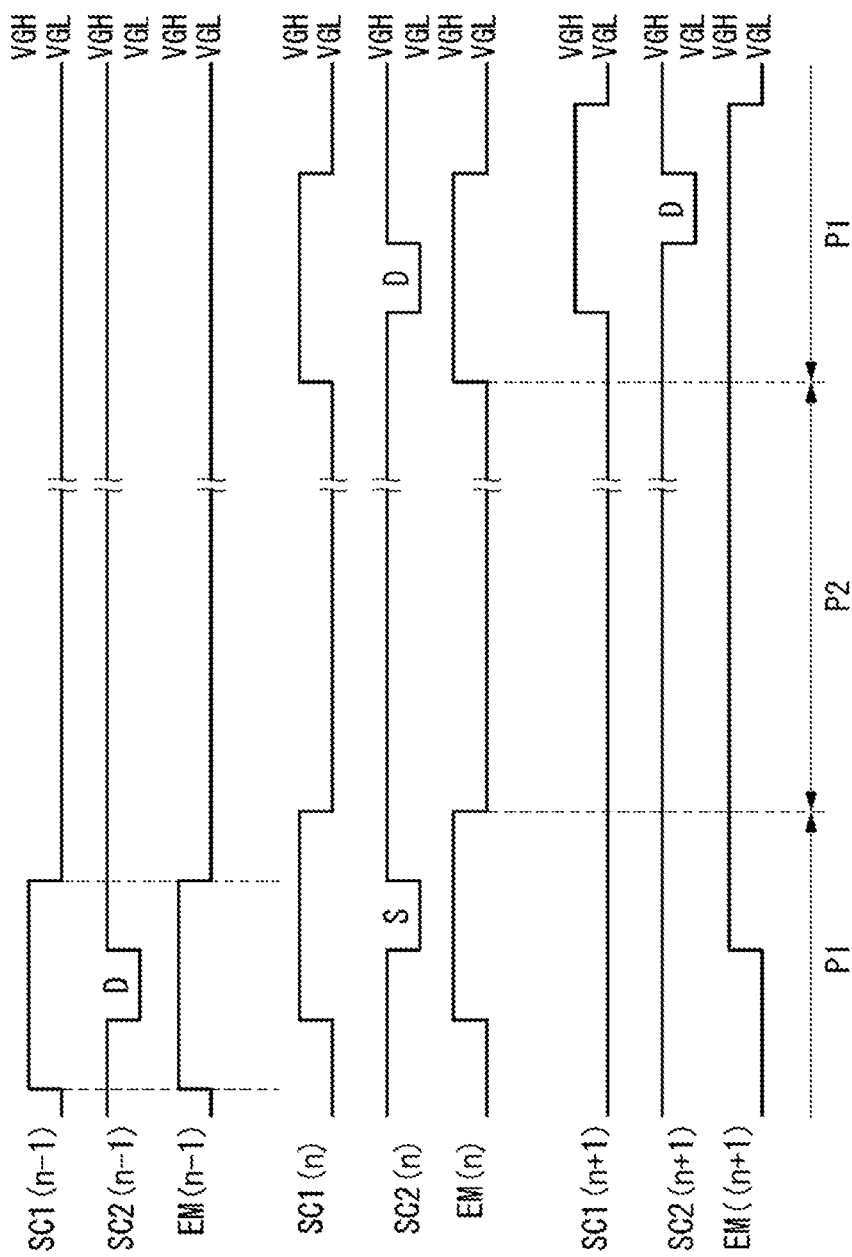
FIG. 9 is a waveform diagram illustrating a gate signal supplied to a pixel circuit shown in FIG. 8.

FIG. 8 is a circuit diagram illustrating an example of a pixel circuit included in each subpixel. FIG. 9 is a waveform diagram illustrating a gate signal supplied to the pixel circuit shown in FIG. 8.

Referring to FIGS. 8 and 9, a pixel circuit includes an OLED, a plurality of TFTs M1 to M3 and DT, a storage capacitor Cst, and the like.

During one horizontal period 1H, gate signals including a first scan signal SC1(n), a second scan signal SC2(n), and an EM signal EM(n) are supplied to the pixel circuit through the gate lines GL.

The GIP circuit 120 includes a first GIP circuit 121 outputting the first scan signal SC1(n) using a first shift register, a second GIP circuit 122 outputting the second scan signal SC2(n) using a second shift register, and a third GIP circuit 123 outputting the EM signal EM(n) using a third shift register. The first and second GIP circuits 121 and 122 may be implemented as a pass gate circuit or an edge trigger circuit. The third GIP circuit 123 may be implemented as an edge trigger circuit. The edge trigger circuit, as shown in FIGS. 6 and 7, may be a circuit capable of controlling an operation of the second period P2 irrespective of an input signal.

The OLED of the pixel circuit is a light emitting element that emits light with an amount of current controlled by a gate-to-source voltage Vgs of the driving TFT DT. A current path of the OLED is switched by the second pixel TFT M2 controlled by the EM signal EM(n). The OLED includes an anode, a cathode, and an organic compound layer between the anode and the cathode. The organic compound layer may include a hole injection layer HIL, a hole transport layer HTL, an emission layer EML, an electron transport layer ETL, and an electron injection layer EIL. However, embodiments are not limited thereto. The anode of the OLED is connected to a third node n3, and the cathode of the OLED is connected to a VSS electrode supplied with a low potential power voltage VSS. The VSS electrode may be at a low potential voltage (e.g., zero volt) less than a pixel driving voltage VDD. However, embodiments are not limited thereto.

The storage capacitor Cst is connected between a second node n2 and the third node n3 and stores the gate-to-source voltage Vgs of the driving TFT DT.

The first pixel TFT M1 may be implemented as an n-type TFT. When the first pixel TFT M1 which is a switching element having a long off-period is implemented as an n-type oxide pixel TFT, the first pixel TFT M1 can reduce power consumption by reducing a leakage current in a low refresh driving mode and prevent a voltage reduction of pixels resulting from the leakage current, thereby preventing a flicker.

The second and third pixel TFTs M2 and M3 may be implemented as a p-type TFT. Because a p-type LTPS TFT has high carrier mobility, it can increase driving efficiency and reduce power consumption. The driving TFT DT may be implemented as an n-type TFT or a p-type TFT. FIG. 8 illustrates an example where the driving TFT DT is implemented as the n-type TFT.

When the first pixel TFT M1 is implemented as the n-type TFT and the second and third pixel TFTs M2 and M3 are implemented as the p-type TFT, the switching elements M1 to M3 have different gate-on voltages. Waveforms of the gate signals applied to the pixel circuit of FIG. 8 are shown in FIG. 9. The first scan signals SC1(n-1) to SC1(n+1) hold the gate-on voltage VGH during one horizontal period 1H and then hold the gate-off voltage VGL during a remaining portion of one frame period. The second scan signals SC2(n-1) to SC2(n+1) are generated at the gate-on voltage VGL in a period of a pulse width less than a pulse width of the first scan signal SC1 in one horizontal period 1H and hold the gate-off voltage VGH during a remaining portion of one frame period. Pulses of the second scan signals SC2(n-1) to SC2(n+1) are synchronized with the data voltages D and S. The EM signals EM(n-1) to EM(n+1) are synchronized with the first scan signals SC1(n-1) to SC1(n+1) and may be generated at the same waveform as the first scan signals SC1(n-1) to SC1(n+1). Voltage levels of the EM signals EM(n-1) to EM(n+1) may be inverted between the gate-on voltage VGL and the gate-off voltage VGH in accordance with a predetermined PWM duty ratio, in order to perform the duty driving of the subpixels 101 during a remaining portion (i.e., an emission period) of one frame period after one horizontal period 1H. When the subpixels 101 perform the duty driving during the emission period, a color representation performance of the subpixels 101 at a low luminance and a low gray level can be improved, and stain such as mura can be prevented.

The first pixel TFT M1 is a switching element that supplies a reference voltage Vref to a second node n2 in response to the first scan signal SC1(n). The first pixel TFT M1 includes a gate connected to a first gate line supplied with the first scan signal SC1(n), a first electrode connected to a second data line 103, and a second electrode connected to the second node n2.

When the reference voltage Vref is supplied to the second data line 103, a data voltage Vdata is supplied to the first data line 102. On the contrary, when the data voltage Vdata is supplied to the second data line 103, the reference voltage Vref may be supplied to the first data line 102.

The second pixel TFT M2 is a switching element that switches the current flowing in the OLED in response to the EM signal EM(n). A gate of the second pixel TFT M2 is connected to a third gate line supplied with the EM signal EM(n). A first electrode of the second pixel TFT M2 is connected to a VDD line supplied with the pixel driving voltage VDD. A second electrode of the second pixel TFT M2 is connected to the first node n1.

The third pixel TFT M3 supplies the data voltage Vdata to the third node n3 in response to the second scan signal SC2(n). The third pixel TFT M3 includes a gate connected to a second gate line supplied with the second scan signal SC2(n), a first electrode connected to the first data line 102, and a second electrode connected to the third node n3.

The driving TFT DT is a driving element that adjusts the current flowing in the OLED depending on the gate-to-source voltage Vgs of the driving TFT DT. The driving TFT DT includes a gate connected to the second node n2, a first electrode connected to the first node n1, and a second electrode connected to the third node n3.

Figure 10:
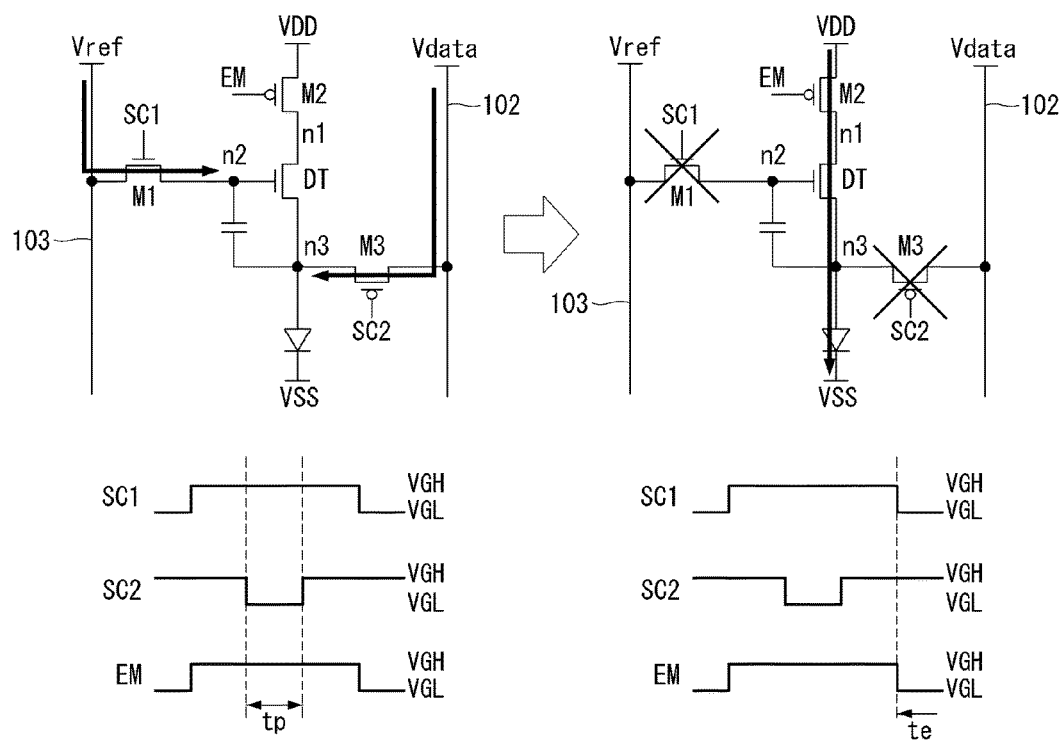
FIG. 10 illustrates an operation of a pixel circuit shown in FIG. 9 in a first period.

FIG. 10 illustrates an operation of the pixel circuit shown in FIG. 9 in a first period.

Referring to FIG. 10, a first period P1 may be divided into a programming period tp and an emission period te.

In the programming period tp, the first scan signal SC1 is generated at the gate-on voltage VGH, and at the same time the second scan signal SC2 is generated at the gate-on voltage VGL. In this instance, the first and third pixel TFTs M1 and M3 are turned on. Hence, the gate of the driving TFT DT is charged with the reference voltage Vref, and the second electrode of the driving TFT DT is charged with the data voltage Vdata. The data voltage Vdata applied to the subpixels in the first period P1 is a video data voltage at the lines other than the nth line and is a sensing data voltage and a video data voltage at the nth line.

In the emission period te, the first scan signal SC1 is inverted to the gate-off voltage VGL, and the second scan signal SC2 is generated at the gate-off voltage VGH. The EM signal EM is inverted to the gate-on voltage or the gate-off voltage in accordance with a predetermined duty ratio. During the emission period te, the OLED of the subpixels supplied with the EM signal EM can emit light because the current flows in the OLED depending on the gate-to-source voltage Vgs of the driving TFT DT through the turn-on of the second pixel TFT M2.

Figure 11:
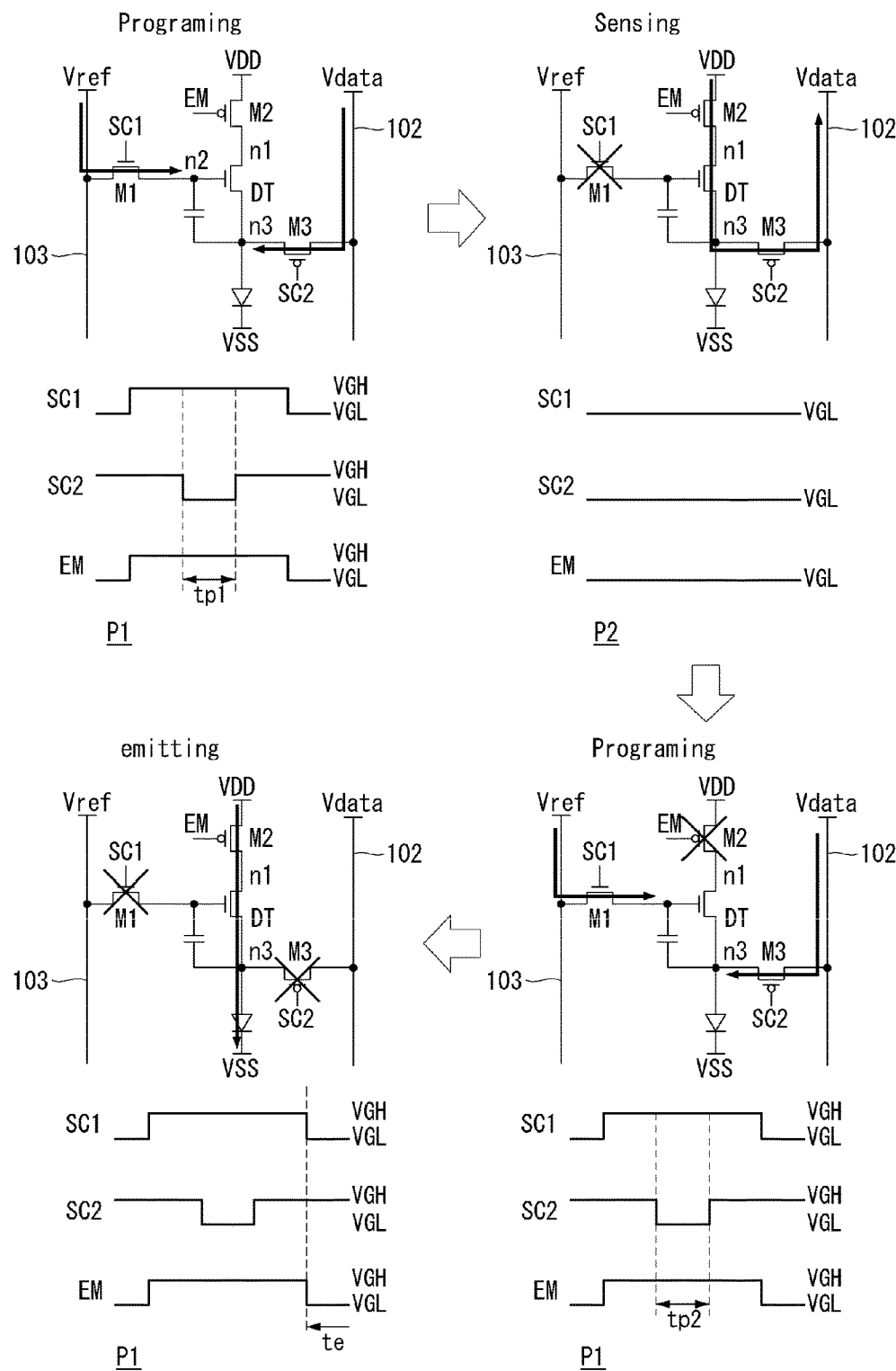
FIG. 11 illustrates an operation of a pixel circuit shown in FIG. 9 in a second period.

FIG. 11 illustrates an operation of the pixel circuit shown in FIG. 9 in a second period.

Referring to FIG. 11, the nth line of the display panel 100 operates in the order of a first programming period tp1 in which sensing data is written, a second period P2 in which subpixels of the nth line are sensed, a second programming period tp2 in which video data is written, and an emission period te.

Since the first programming period tp1, the second programming period tp2, and the emission period te are substantially the same as a description of FIG. 10, a detailed description thereof is omitted.

During the second period P2, the first scan signal SC1 is generated at the gate-off voltage VGL, and the second scan signal SC2 and the EM signal EM are generated at the gate-on voltage VGL. In the subpixel charged with the sensing data voltage, electrical characteristics of the subpixels on the nth line are sensed through a sensing path including the second pixel TFT M2, the driving TFT DT, the third pixel TFT M3, and the data line 102 for the second period P2.

Figure 12:
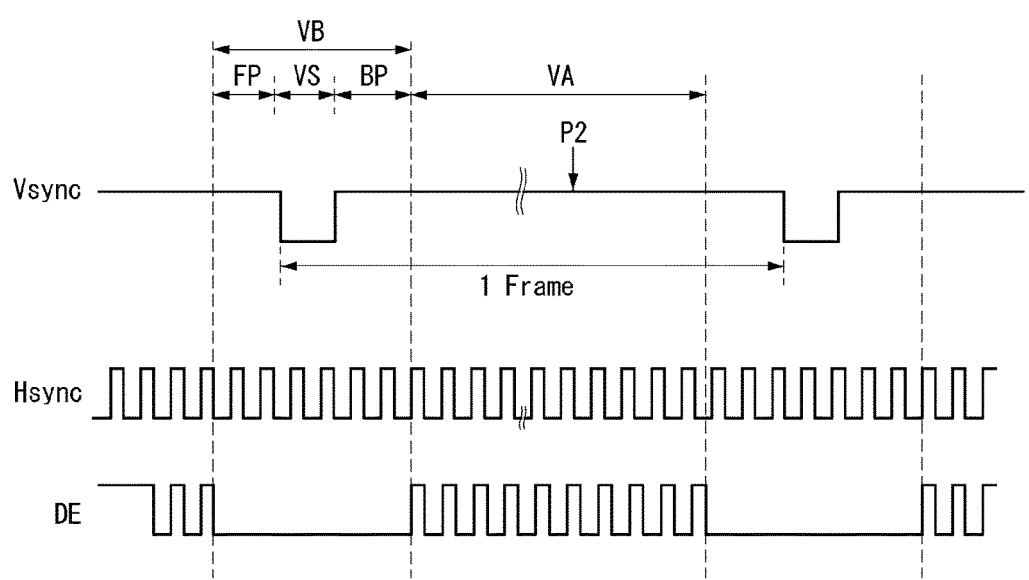
FIG. 12 is a waveform diagram illustrating in detail one frame period of a display device.

FIG. 12 is a waveform diagram illustrating in detail one frame period of a display device.

Referring to FIG. 12, the vertical sync signal Vsync defines one frame period. The horizontal sync signal Hsync defines one horizontal period. The data enable signal DE defines an effective data period including video data (or pixel data) to be displayed on the pixel array of the display panel 100.

The data enable signal DE is synchronized with the video data to be displayed on the pixel array of the display panel 100. One pulse cycle of the data enable signal DE is one horizontal period, and a high logic period of the data enable signal DE indicates input timing of data to be written to pixels of one line of the display panel 100. One horizontal period 1H is time required to write data to pixels of one pixel line of the display panel 100.

The timing controller 130 receives the data enable signal DE and video data of an input image for a vertical active time VA. There is no data enable signal DE and video data of the input image received by the timing controller 130 for a vertical blank time VB. Namely, the timing controller 130 receives data corresponding to one frame to be written to all the pixels of the display panel 100 for the vertical active time VA. One frame period is equal to a sum of the vertical active time VA and the vertical blank time VB.

As can be seen from the data enable signal DE, the display device receives no video data for the vertical blank time VB. The vertical blank time VB includes a vertical sync time VS, a vertical front porch FP, and a vertical back porch BP. The vertical sync time VS equals time from a falling edge to a rising edge of the vertical sync signal Vsync and indicates start (or end) timing of one screen. The vertical front porch FP equals time from a falling edge of a last data enable signal DE indicating a last line data timing of one frame data to a start of the vertical sync time VS. The vertical back porch BP equals time from an end of the vertical sync time VS to a rising edge of a first data enable signal DE indicating a first line data timing of one frame data.

Embodiments of the disclosure sense in real time a specific line of the display panel, in order to perform the sensing operation using the above-described GIP circuit 120 during the progressive scan process in the second period P2 of the vertical active time VA. The second period P2 is set within the vertical active time VA as shown in FIGS. 12 to 14.

Figure 13:
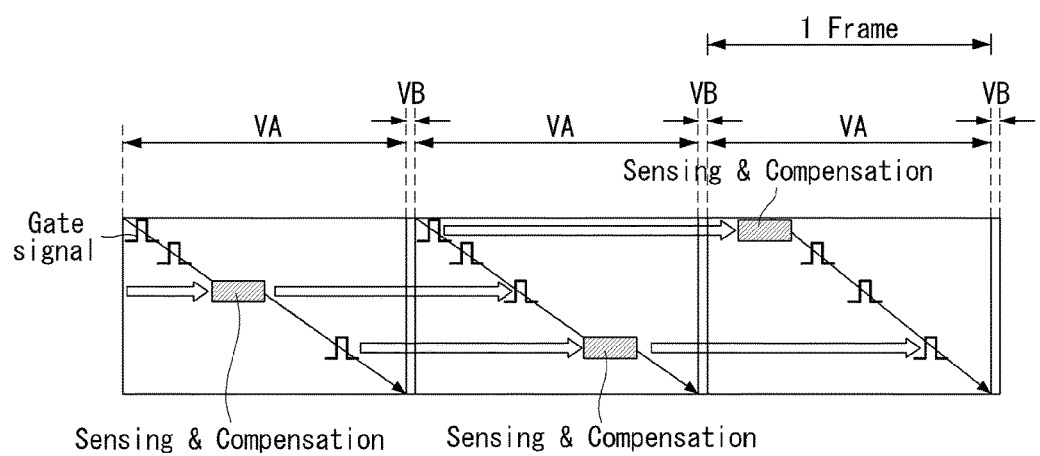
FIGS. 13 and 14 illustrate an example where a line of a display panel is sensed in real time during a progressive scan process for a vertical active time of one frame period.
Figure 14:
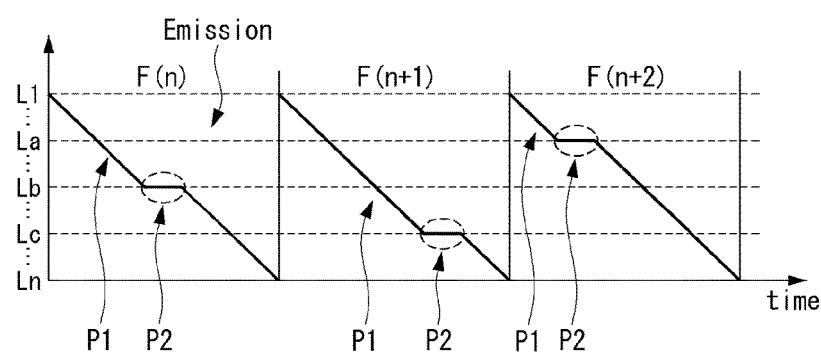

FIGS. 13 and 14 illustrate an example where a line of a display panel is sensed in real time during a progressive scan process for a vertical active time of one frame period.

Referring to FIGS. 13 and 14, one frame data of an input image is sequentially scanned to all the lines of the display panel 100 and is written to the subpixels 101 in a vertical active time VA. Embodiments of the disclosure sense in real time subpixels of a specific line during a progressive scan process in the vertical active time VA and can compensate in real time for a variation between the subpixels or changes in the subpixels over time based on a sensing result. Thus, because embodiments of the disclosure do not need to sense the subpixels using a vertical blank time VB, a limitation of a sensing time resulting from the vertical blank time VB can be solved.

The number of lines sensed in one vertical active time VA is not limited to one. At least one line can be sensed in one vertical active time VA. When a plurality of lines is sensed in one vertical active time VA, the plurality of lines can be sequentially sensed.

A subpixel does not emit light with a sensing data voltage applied to the subpixel. Thus, a line sensed during the progressive scan process can be sensed in a state where the line does not emit light.

A location of the line sensed on the display panel may be changed in each frame period as shown in FIGS. 13 and 14. When a location of the line to be sensed changes on a time axis, a luminance variation between the lines resulting from a luminance reduction of the line to be sensed is not recognized. In FIG. 14, "L1 to Ln" indicate locations of the lines of the display panel 100. In an example of FIG. 14, a b-th line Lb is sensed in an nth frame F(n), and a c-th line Lc is sensed in a (n+1)th frame F(n+1). Subsequently, an a-th line La is sensed in a (n+2)th frame F(n+2).

Figure 15:
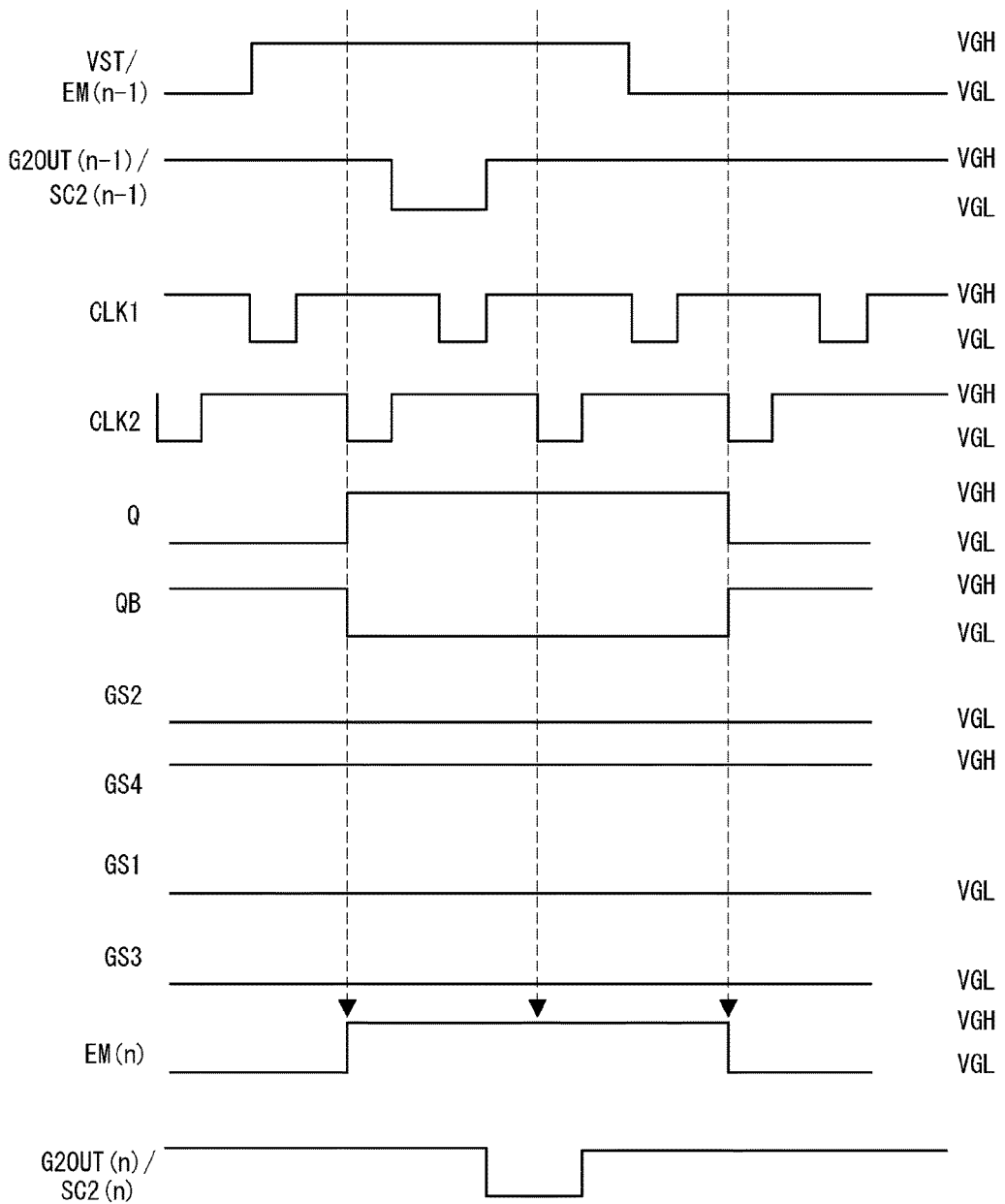
FIG. 15 is an input and output waveform diagram illustrating an operation of an nth stage of a GIP circuit shown in FIG. 6 in a first period.

FIG. 15 is an input and output waveform diagram illustrating an operation of an nth stage of the GIP circuit shown in FIG. 6 in a first period.

Referring to FIG. 15, when G2OUT(n−1) is at a gate-on voltage VGL in a first period P1 in which the display panel 100 is scanned in sequence, the second line control signal GS2 may be set to the gate-on voltage VGL and the fourth line control signal GS4 may be set to a gate-off voltage VGH. Further, when the G2OUT(n−1) is at the gate-on voltage VGL in the first period P1, the first and third line control signals GS1 and GS3 may be set to the gate-on voltage VGL. Voltages of the first to fourth line control signals GS1 to GS4 can be held constant in the first period P1 as shown in FIG. 7.

Figure 16:
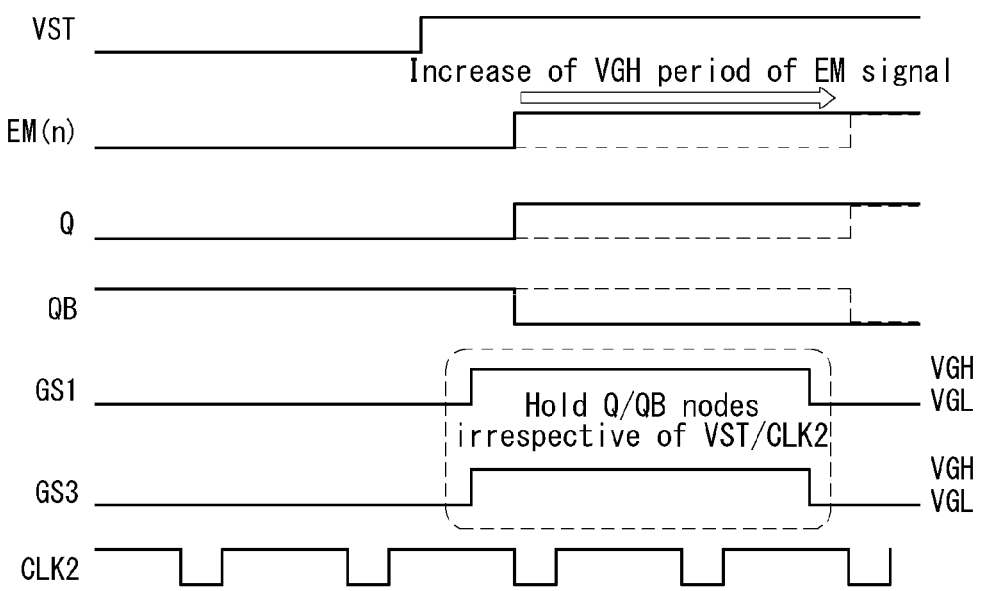
FIG. 16 is a waveform diagram illustrating an example of adjusting an output signal waveform of a GIP circuit using line control signals and compensating for a luminance of a subpixel.
Figure 17:
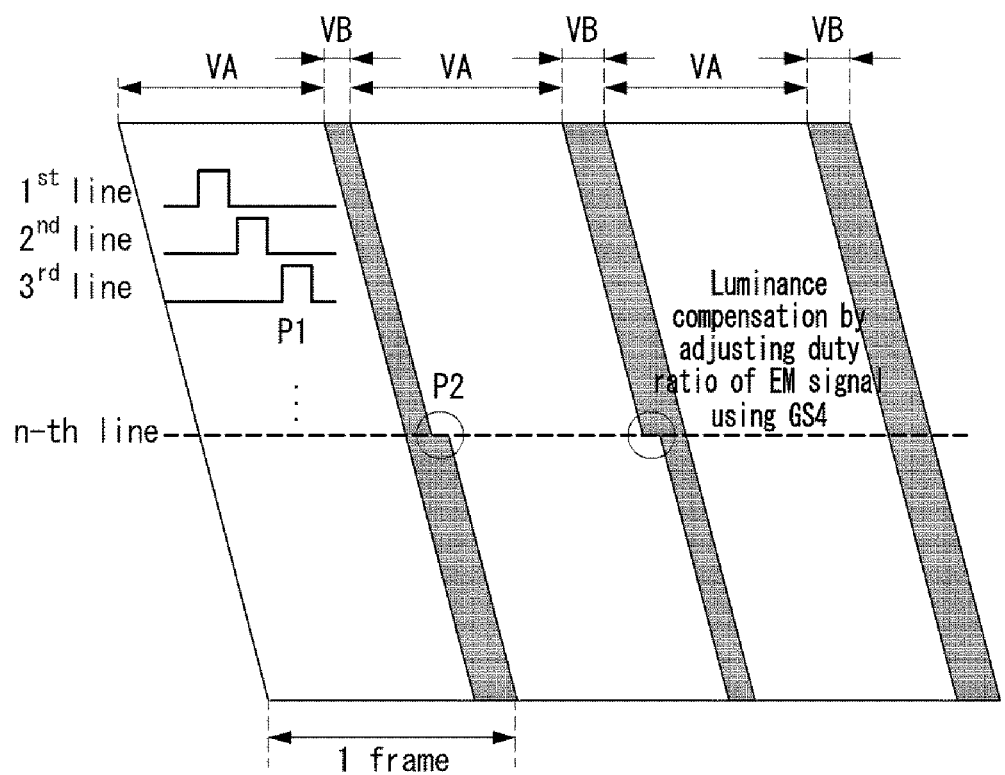
FIG. 17 illustrates a method of compensating for a luminance reduction resulting from a second period using a third line control signal.
Figure 17:
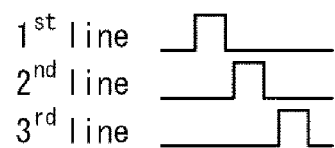
Figure 17:
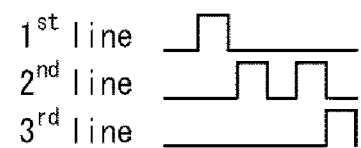

FIG. 16 illustrates an example of adjusting an output signal waveform of the GIP circuit through the first and third line control signals GS1 and GS3, and compensating for a luminance of a subpixel. FIG. 17 illustrates a method of compensating for a luminance reduction resulting from a second period using the third line control signal GS3.

Referring to FIGS. 16 and 17, the first line control signal GS1 blocks a current path between the VST node IN1 and the Q node Q and controls a voltage of the Q node Q irrespective of the input signals VST and CLK2 of the edge trigger circuit, thereby adjusting a waveform of an output signal (i.e., EM signal EM(n)) of the edge trigger circuit. When the first line control signal GS1 is at the gate-off voltage VGH, the current path between the VST node IN1 and the Q node Q is blocked. When a period in which the voltage of the EM signal EM(n) is held constant needs to increase as shown in FIG. 7, the first line control signal GS1 is generated at the gate-off voltage VGH.

The third line control signal GS3 blocks a current path between input nodes and the QB node QB, so that the voltage of the QB node QB is not changed depending on the voltages of the VST node IN1 and the CLK node IN2. When the third line control signal GS3 is generated at the gate-off voltage VGH, changes in the voltage of the EM signal EM(n) are prevented because the QB node QB is held at the gate-off voltage VGH. As shown in FIG. 17, the luminance reduction resulting from the second period P2 can be compensated by increasing an emission time te of lines subsequent to an nth line to be sensed using the third line control signal GS3.

A waveform shown in FIG. 17 is a waveform of "G2OUT (n)/SC2(*n*)" in FIG. 7. Further, a waveform of "$2^{nd}$ line" in FIG. 17 is the waveform of "G2OUT(n)/SC2(*n*)" in FIG. 7.

Figure 18:
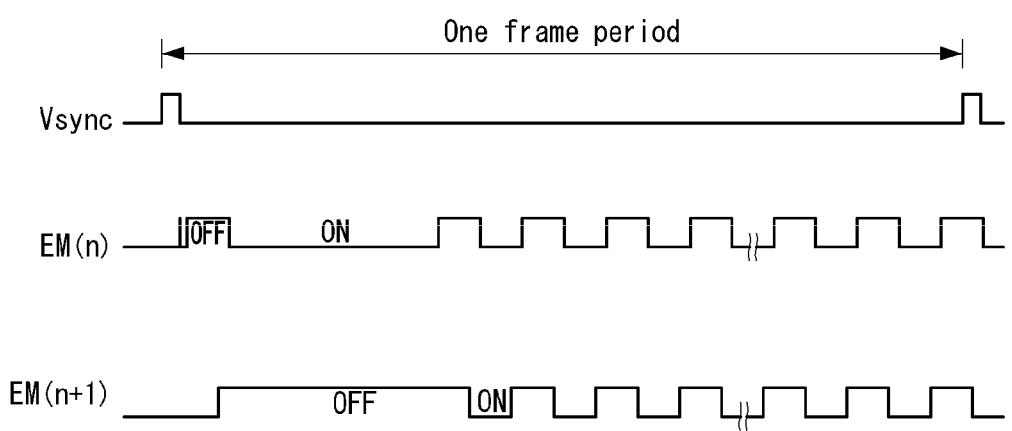
FIG. 18 is a waveform diagram illustrating a pulse width modulation (PWM) waveform of an emission signal of a subpixel during an emission period.

FIG. 18 is a waveform diagram illustrating a PWM waveform of an EM signal of a subpixel during an emission period.

Referring to FIG. 18, during an emission period te, voltages of EM signals EM(n) and EM(n+1) are inverted in accordance with a predetermined PWM duty ratio. The nth EM signal EM(n) to be sensed is held at the gate-on voltage VGL, so that a current can flow in the driving elements of the subpixels 101 connected to the nth line in the second period P2. Further, the (n+1)th EM signal EM(n+1) supplied to the subpixels 101 of the (n+1)th line in the second period P2 is held at the gate-off voltage VGH, so that the current does not flow in the subpixels 101 during the second period P2.

A gate driver circuit and a display device using the same according to various embodiments of the disclosure will be described as follows.

A gate driver circuit according to embodiments of the disclosure includes a first transistor configured to supply a start signal to a Q node in response to a clock, a second transistor configured to adjust a gate voltage of the first transistor in response to the clock, a third transistor configured to adjust a gate voltage of the second transistor in response to the start signal, a fourth transistor turned on depending on a voltage of the Q node and configured to change a voltage of a QB node, a fifth transistor configured to switch a current path between the first transistor and the Q node in response to a first line control signal, a sixth transistor turned on depending on the voltage of the Q node and configured to supply a gate-off voltage to an output node, a seventh transistor turned on depending on the voltage of the QB node and configured to supply a gate-on voltage to the output node, an eighth transistor configured to supply a second line control signal to the QB node in response to a line designation signal indicating a location of a specific line, and a ninth transistor configured to switch a current path between the second transistor and the QB node in response to a third line control signal, wherein the first to third line control signals are generated independently of the start signal and the clock. Thus, a method for outputting a gate signal to any line of a display panel during a progressive scan process can be changed.

A voltage of the first line control signal may be the gate-on voltage during a first period and may be the gate-off voltage during a second period.

The second line control signal may be inverted from the gate-on voltage to the gate-off voltage in the first period before an edge timing at which the first line control signal is inverted to the gate-off voltage. A voltage of the output node may be inverted from the gate-on voltage to the gate-off voltage at an edge timing at which a voltage of the second line control signal is inverted from the gate-off voltage to the gate-on voltage. When a voltage of the third line control signal is the gate-off voltage, the voltage of the output node may be generated at the gate-on voltage. When the voltage of the third line control signal is the gate-on voltage, the voltage of the output node may be generated at the gate-off voltage.

The gate driver circuit may further include a tenth transistor configured to supply a fourth line control signal to the Q node in response to the line designation signal. The fourth line control signal may be generated independently of the start signal and the clock.

The fourth line control signal may be held at the gate-off voltage during the first period and may be inverted to the gate-on voltage during the second period.

The first to ninth transistors may be p-type transistors.

The gate driver circuit may further include an eleventh transistor configured to switch a current path between the Q node and a first power node supplied with the gate-on voltage depending on the voltage of the QB node.

A display device according to embodiments of the disclosure includes a pixel array including data lines, gate lines, and subpixels, a data driver configured to supply a data signal of an input image to the data lines, and a gate driver configured to supply a gate signal to the gate lines through an output node, wherein a pixel circuit included in each subpixel includes one or more n-type transistors and one or more p-type transistors, wherein the gate driver includes a first transistor configured to supply a start signal to a Q node in response to a clock, a second transistor configured to adjust a gate voltage of the first transistor in response to the clock, a third transistor configured to adjust a gate voltage of the second transistor in response to the start signal, a fourth transistor turned on depending on a voltage of the Q node and configured to change a voltage of a QB node, a fifth transistor configured to switch a current path between the first transistor and the Q node in response to a first line control signal, a sixth transistor turned on depending on the voltage of the Q node and configured to supply a gate-off voltage to the output node, a seventh transistor turned on depending on the voltage of the QB node and configured to supply a gate-on voltage to the output node, an eighth transistor configured to supply a second line control signal to the QB node in response to a line designation signal indicating a location of a specific line, and a ninth transistor configured to switch a current path between the second transistor and the QB node in response to a third line control signal, wherein the first to third line control signals are generated independently of the start signal and the clock. Thus, a method for outputting a gate signal to any line of a display panel during a progressive scan process can be changed.

The display device may further include a tenth transistor configured to supply a fourth line control signal to the Q node in response to the line designation signal. The fourth line control signal is generated independently of the start signal and the clock.

The first period of the gate driver circuit may be used as a progressive scan time. And the second period may be used as a hold time.

The second period may be set according to time required to sense one line of the display panel.

The gate signal may include an emission signal defining an emission time of the subpixels.

The gate driver circuit may be on the same substrate as the pixel circuits of the display device.

The display panel driving circuits may be configured to be operated in a low refresh driving mode or in a normal driving mode.

As described above, the present disclosure can control the edge trigger circuit outputting the gate signal using a predetermined line control signal and can temporarily hold a voltage of the nth gate line in one frame period. The present disclosure can sense electrical characteristics of subpixels of a specific line during the progressive scan process, in which lines of the display panel are scanned in sequence, in one frame period, write video data to the sensed subpixels, and then resume the progressive scanning again.

The present disclosure can minutely adjust a luminance of each line using the line control signals when there is a luminance difference between the lines of the display panel, thereby improving the luminance difference between the lines.

It will be apparent to those skilled in the art that various modifications and variations can be made in gate driver circuit and the display device using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driver circuit, comprising:
   a first transistor supplying a start signal to a Q node in response to a clock;
   a second transistor adjusting a gate voltage of the first transistor in response to the clock;
   a third transistor adjusting a gate voltage of the second transistor in response to the start signal;
   a fourth transistor turned on depending on a voltage of the Q node and changing a voltage of a QB node;
   a fifth transistor switching a current path between the first transistor and the Q node in response to a first line control signal;
   a sixth transistor turned on depending on the voltage of the Q node and supplying a gate-off voltage to an output node;
   a seventh transistor turned on depending on the voltage of the QB node and supplying a gate-on voltage to the output node;
   an eighth transistor supplying a second line control signal to the QB node in response to a line designation signal indicating a location of a specific line; and
   a ninth transistor switching a current path between the second transistor and the QB node in response to a third line control signal.

2. The gate driver circuit of claim 1, wherein the gate driver circuit is coupled to a timing controller providing the first to third line control signals, the first to third line control signals being generated independently of the start signal and the clock.

3. The gate driver circuit of claim 1, wherein a voltage of the first line control signal is the gate-on voltage during a first period and is the gate-off voltage during a second period.

4. The gate driver circuit of claim 3, wherein the second line control signal is inverted from the gate-on voltage to the gate-off voltage in the first period before an edge timing at which the first line control signal is inverted to the gate-off voltage,
   wherein a voltage of the output node is inverted from the gate-on voltage to the gate-off voltage at an edge timing at which a voltage of the second line control signal is inverted from the gate-off voltage to the gate-on voltage.

5. The gate driver circuit of claim 4, wherein when a voltage of the third line control signal is the gate-off voltage, the voltage of the output node is generated at the gate-on voltage,
   wherein when the voltage of the third line control signal is the gate-on voltage, the voltage of the output node is generated at the gate-off voltage.

6. The gate driver circuit of claim 4, further comprising a tenth transistor supplying a fourth line control signal to the Q node in response to the line designation signal,
   wherein the fourth line control signal is generated independently of the start signal and the clock.

7. The gate driver circuit of claim 6, wherein the fourth line control signal is held at the gate-off voltage during the first period and is inverted to the gate-on voltage during the second period.

8. The gate driver circuit of claim 7, wherein the first to ninth transistors are p-type transistors.

9. The gate driver circuit of claim 6, further comprising an eleventh transistor switching a current path between the Q node and a first power node supplied with the gate-on voltage depending on the voltage of the QB node.

10. The gate driver circuit of claim 3, wherein the first period of the gate driver circuit is used as a progressive scan time, wherein the second period is used as a hold time.

11. The gate driver circuit of claim 3, wherein the second period is set according to time required to sense one line of the display panel.

12. A display device, comprising:
   a pixel array including data lines, gate lines, and subpixels;
   a data driver supplying a data signal of an input image to the data lines; and
   a gate driver supplying a gate signal to the gate lines through an output node,
   wherein a pixel circuit included in each subpixel includes one or more n-type transistors and one or more p-type transistors,
   wherein the gate driver comprises:
   a first transistor supplying a start signal to a Q node in response to a clock;

a second transistor adjusting a gate voltage of the first transistor in response to the clock;

a third transistor adjusting a gate voltage of the second transistor in response to the start signal;

a fourth transistor turned on depending on a voltage of the Q node and changing a voltage of a QB node;

a fifth transistor switching a current path between the first transistor and the Q node in response to a first line control signal;

a sixth transistor turned on depending on the voltage of the Q node and supplying a gate-off voltage to the output node;

a seventh transistor turned on depending on the voltage of the QB node and supplying a gate-on voltage to the output node;

an eighth transistor supplying a second line control signal to the QB node in response to a line designation signal indicating a location of a specific line; and a ninth transistor switching a current path between the second transistor and the QB node in response to a third line control signal, wherein the first to third line control signals are generated independently of the start signal and the clock.

13. The display device of claim 12, further comprising a tenth transistor supplying a fourth line control signal to the Q node in response to the line designation signal, wherein the fourth line control signal is generated independently of the start signal and the clock.

14. The display device of claim 12, wherein the gate signal includes an emission signal defining an emission time of the subpixels.

15. The display device of claim 12, wherein the gate driver circuit is on the same substrate as the pixel circuits of the display device.

16. The display device of claim 12, wherein the display panel driving circuits are configured to be operated in a low refresh driving mode or in a normal driving mode.

* * * * *